United States Patent
Qin et al.

(10) Patent No.: US 7,243,313 B1
(45) Date of Patent: Jul. 10, 2007

(54) SYSTEM AND METHOD FOR REDUCING THE SIZE OF RC CIRCUITS

(75) Inventors: Wangguo Qin, Fremont, CA (US); Bruce W. McGaughy, Fremont, CA (US); Jun Kong, San Jose, CA (US); Qingjian Yu, Nanjing (CN)

(73) Assignee: Cadence Design Systems, Inc., San Jose, CA (US)

( * ) Notice: Subject to any disclaimer, the term of this patent is extended or adjusted under 35 U.S.C. 154(b) by 400 days.

(21) Appl. No.: 10/721,673

(22) Filed: Nov. 24, 2003

(51) Int. Cl.
    *G06F 17/50* (2006.01)
(52) U.S. Cl. ............. 716/2; 716/3; 716/6; 716/13; 716/14; 716/7
(58) Field of Classification Search ............. 716/2, 716/3, 5, 6, 13, 14, 7
    See application file for complete search history.

(56) References Cited

U.S. PATENT DOCUMENTS

| | | | | |
|---|---|---|---|---|
| 5,689,685 A * | 11/1997 | Feldmann et al. | ............. | 703/2 |
| 5,818,729 A * | 10/1998 | Wang et al. | ............. | 716/9 |
| 5,901,063 A * | 5/1999 | Chang et al. | ............. | 716/4 |
| 6,188,974 B1 * | 2/2001 | Cullum et al. | ............. | 703/14 |
| 6,286,126 B1 * | 9/2001 | Raghavan et al. | ............. | 716/6 |
| 6,327,542 B1 * | 12/2001 | McBride | ............. | 702/64 |
| 6,349,272 B1 * | 2/2002 | Phillips | ............. | 703/2 |
| 6,353,917 B1 * | 3/2002 | Muddu et al. | ............. | 716/6 |
| 6,510,542 B1 * | 1/2003 | Kojima | ............. | 716/10 |
| 6,581,197 B1 * | 6/2003 | Foutz et al. | ............. | 716/6 |
| 6,601,223 B1 * | 7/2003 | Puri et al. | ............. | 716/6 |
| 6,604,227 B1 * | 8/2003 | Foltin et al. | ............. | 716/6 |
| 6,609,233 B1 * | 8/2003 | Foltin et al. | ............. | 716/6 |
| 6,662,149 B1 * | 12/2003 | Devgan et al. | ............. | 703/14 |
| 6,687,658 B1 * | 2/2004 | Roychowdhury | ............. | 703/2 |
| 6,728,939 B2 * | 4/2004 | Johannsen | ............. | 716/5 |
| 6,928,630 B2 * | 8/2005 | Moon et al. | ............. | 716/6 |
| 7,024,652 B1 * | 4/2006 | McGaughy et al. | ............. | 716/12 |
| 7,137,097 B1 * | 11/2006 | Aji et al. | ............. | 716/12 |
| 7,149,986 B2 * | 12/2006 | Weber | ............. | 716/4 |
| 2002/0138812 A1 * | 9/2002 | Johannsen | ............. | 716/5 |
| 2002/0147958 A1 * | 10/2002 | Teig et al. | ............. | 716/12 |
| 2002/0198696 A1 * | 12/2002 | Sanchez et al. | ............. | 703/14 |
| 2003/0115557 A1 * | 6/2003 | Elzinga | ............. | 716/4 |
| 2003/0121013 A1 * | 6/2003 | Moon et al. | ............. | 716/6 |

(Continued)

FOREIGN PATENT DOCUMENTS

JP    2003218204 A  *  7/2003

OTHER PUBLICATIONS

Pong et al., "A Parasitics Extraction and Network Reduction Algorithm for Analog VLSI", IEEE Transactions on Computer-Aided Design, vol. 10, No. 2, Feb. 1991, pp. 145-149.*

(Continued)

*Primary Examiner*—Phallaka Kik
(74) *Attorney, Agent, or Firm*—Morrison & Foerster LLP

(57) ABSTRACT

A method of transforming a first topology to a reduced topology is disclosed. One preferred embodiment of the present invention includes a method of transforming a circuit from a first topology to a reduced topology, said first topology comprising a plurality of inter-connected circuit elements. The method comprises the steps of: (a) identifying one or more circuit elements; (b) analyzing the effect of reducing one or more of said identified circuit elements on the topological and physical characteristics of said circuit; and (c) if the effect satisfies a first standard, generating a second topology reflecting the reduction of one or more identified circuit elements.

55 Claims, 19 Drawing Sheets

U.S. PATENT DOCUMENTS

| | | | |
|---|---|---|---|
| 2003/0125919 A1* | 7/2003 | Chikamichi | 703/14 |
| 2003/0204821 A1* | 10/2003 | Weber | 716/1 |
| 2004/0044979 A1* | 3/2004 | Aji et al. | 716/13 |
| 2004/0049746 A1* | 3/2004 | Rao et al. | 716/4 |
| 2004/0078767 A1* | 4/2004 | Burks et al. | 716/8 |
| 2004/0103386 A1* | 5/2004 | Becer et al. | 716/13 |
| 2005/0021319 A1* | 1/2005 | Li et al. | 703/2 |
| 2006/0010412 A1* | 1/2006 | Teig et al. | 716/8 |

OTHER PUBLICATIONS

Yu et al., "New Efficient and Accurate Moment Matching Based Model For Crosstalk Estimation in Coupled RC Trees", 2001 International Symposium on Quality Electronic Design, Mar. 26, 2001, pp. 151-157.*

Oten et al., "Topological Dimensionality Determination and Dimensionality Reduction Based on Minimum Spanning Trees", Proceedings of 1998 IEEE International Symposium on Circuits and Systems, May 31, 1998, vol. 3, pp. 366-369.*

Hui et al., "Enhancing the Efficiency of Reduction of Large RC Networks by Pole Analysis via Congruence Transformations", Proceedings of the ASP-DAC Asia and South Pacific Design Automation Conference, vol. 1, Jun. 18, 1999, pp. 89-92.*

Harbour et al., "Simple RC Model for Integrated Multiterminal Interconnections", IEE Proceedings of Circuits, Devices and Systems, vol. 135, No. 1, Feb. 1988, pp. 19-23.*

Zheng et al., "Efficient and Accurate Modeling of Power Supply Noise on Distributed On-Chip Power Networks", IEEE International Symposium on CIrcuits and Systems, May 28-31, 2000, pp. II-513-516.*

Chen et al., "A Novel Method for Worst-Case Interconnect Delay Estimation", IEEE Trnasactions on Circuits and Systems—I: Fundamental Theory and Applications, vol. 50, No. 6, Jun. 2003, pp. 778-781.*

Liao et al., "Partitioning and Reduction of RC Interconnect Networks Based on Scattering Parameter Macromodels", 1995 IEEE/ACM International Conference on Computer-Aided Design, Nov. 5-9, 1995, pp. 704-709.*

Batterywala et al., "Time Domain Method for Reduced Order Network Synthesis of Large RC Circuits", Proceedings of the 1998 IEEE International Symposium on Circuits and Systems, vol. 6, May 31, 1998, pp. 82-85.*

Hou et al., "Improved Delay Time Estimation of RC Ladder Networks", IEEE Transactions on CIrcuits and Systems I: Fundamental Theory and Applications, vol. 47, No. 2, Feb. 2000, pp. 242-246.*

Kerns et al., "Stable and Efficient Reduction of Large, Multiport RC Networks by Pole Analysis via Congruence Transformations", IEEE Transactions on Computer-Aided Design of Integrated Circuits and Systems, vol. 16, No. 7, Jul. 1997, pp. 734-744.*

Schroter, "Simulation and Modeling of the Low-Frequency Base Resistance of Bipolar Transistors and Its Dependence of Current and Geometry", IEEE Transactions on Electron Devices, vol. 38, No. 3, Mar. 1991, pp. 538-544.*

Pillage, L. T. et al. (Apr. 1990). "Asymptotic Waveform Evaluation, for Timing Analysis" *IEEE Transactions on Computer-Aided Design* 9(4):352-366.

Liao, H.; et al. (1995). "Partitioning and Reduction of RC Interconnect Networks Based on Scattering Parameter Macromodels," *ICCAD '95, IEEE/ACM International Conference on Computer Aided Design, Digest of Technical Papers*, Nov. 5-9, 1995, IEEE Computer Society Press, San Jose, California, United States, pp. 704-709.

Sheehan, B. N. (1999). "TICER: Realizable Reduction of Extracted RC Circuits," *ICCAD '99, IEEE/ACM International Conference on Computer Aided Design, Digest of Technical Papers*, Nov. 7-11, 1999, IEEE Computer Society Press, San Jose, California, United States, pp. 200-203.

Weiss, M. A. (1997). *Data Structures and Algorithm Analysis in C*, 2nd Edition, Addison-Wesley, Table of Contents only, 9 pages.

* cited by examiner

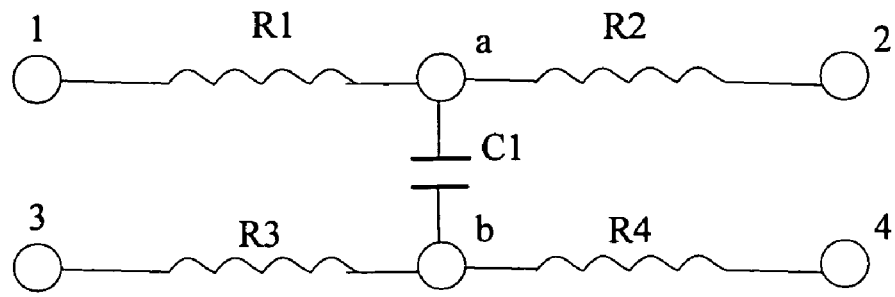
Figure 4A
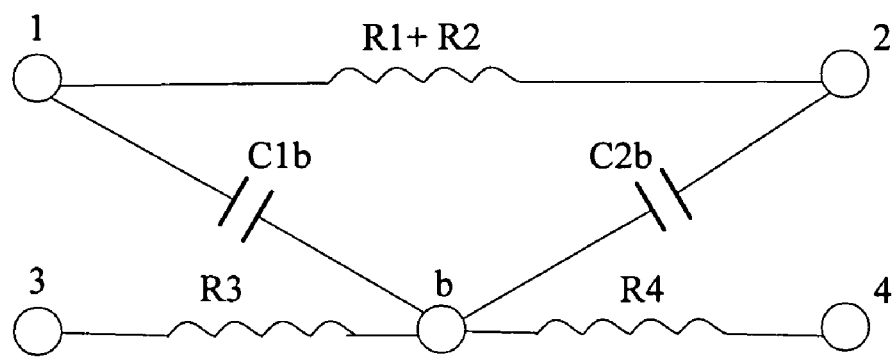
Figure 4B
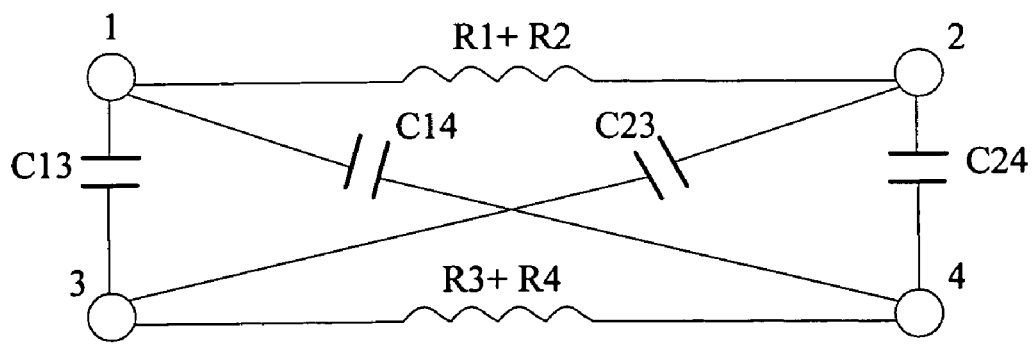
Figure 4C
Figure 4

Step response of node N1 before eliminating N2

Step response of node N1 after eliminating N2

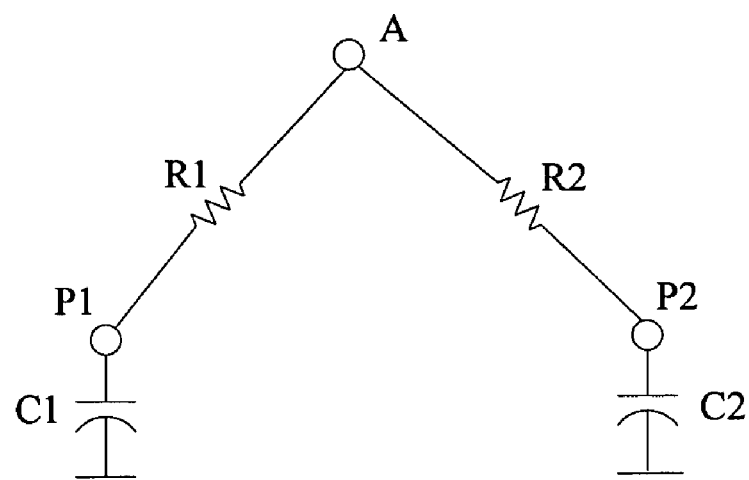
Figure 18A
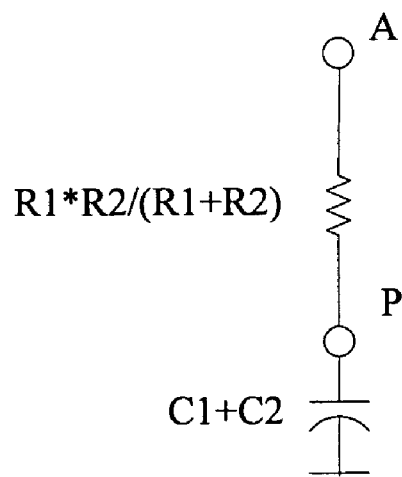
Figure 18B
Figure 18

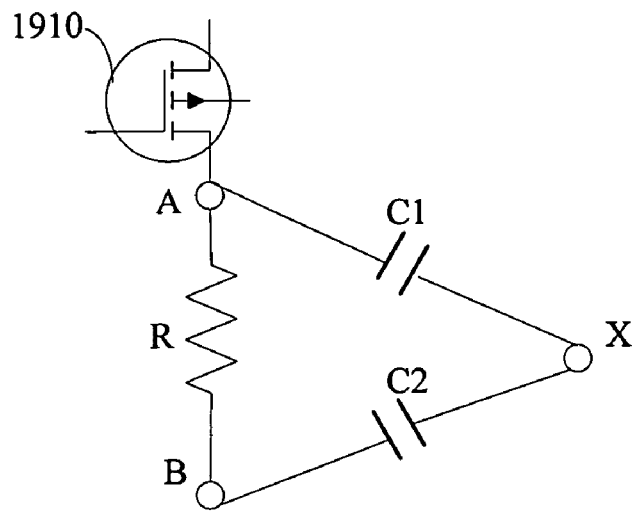
Figure 19A
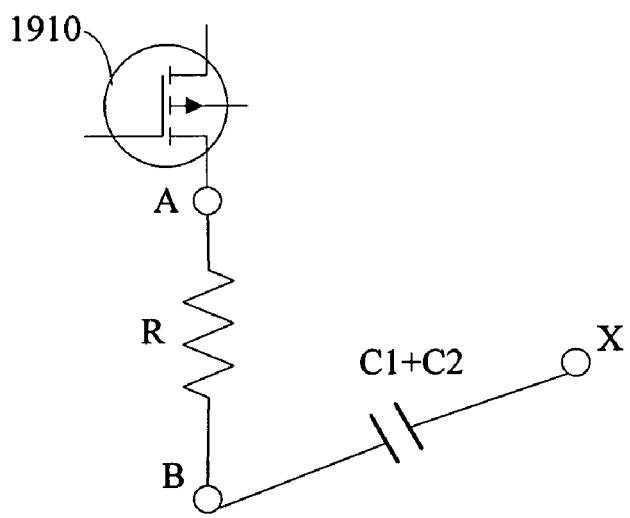
Figure 19B
Figure 19

SYSTEM AND METHOD FOR REDUCING THE SIZE OF RC CIRCUITS

FIELD OF INVENTION

This invention relates in general to circuit analysis and in particular to a system and method for transforming a circuit from its original topology to a reduced topology.

BACKGROUND OF INVENTION

Modern circuit simulations or verifications often encounter circuit models having a large number of inter-connected circuit elements. For example, during the final timing verification of Integrated circuits (IC), the number of parasitic resistors and capacitors in the circuit model may reach or exceed $10^7$. In order to improve the efficiency of circuit analysis, a variety of RC reduction technologies have been developed during the last decade.

The dominant trend in RC reduction has been towards transforming the original RC circuit network into a mathematical macro-model so that certain mathematical techniques can be utilized to generate a reduced mathematical circuit model. (See Rohrer et. al., "Asymptotic Waveform Evaluation for Timing Analysis", IEEE Trans. Computer Aided Design, vol. 9, pp. 352–66, 1990.) Such transformations also preserve the electrical properties of each input and output port. A disadvantage of these transformations, however, is that the reduced circuit model is not realizable. In other words, the reduced mathematical circuit model contains higher order elements that can not be realized as RC circuits. A drawback associated with this unrealizability is that the resulting mathematical models may presume special, often non-standard simulator capabilities.

Liao et al. in "Partitioning and Reduction of RC Interconnect Networks Based on Scattering Parameter Macromodels", ICCAD 1995, pp. 704–09 (hereinafter "Liao") presented a realizable reduction scheme in which the original circuit model was partitioned into several sub-circuits. Each sub-circuit was then synthesized to produce a reduced sub-network that approximates the original sub-circuit. A weakness of the approach in Liao is that the reduction scheme may not be effective for circuits containing certain types of circuit topologies, such as coupling capacitors or an unbalanced tree in a memory block. Moreover, there is no guarantee that errors resulted from the approximations are controlled to a minimized or negligible level so that certain properties of the original circuit are preserved.

Sheehan in "TICER: Realizable Reduction of Extracted RC Circuits", ICCAD 1999 (hereinafter "TICER") proposed a method of achieving realizable reduction of RC circuit with certain controlled accuracy in the neighborhood of an eliminated node. Details of Sheehan's method can be found in TICER, the content of which is incorporated hereby in its entirety as reference. Sheehan's method is based on node elimination. According to Sheehan, a node can be a quick, slow, or normal node depending on its time constant. The time constant of a node N is the total capacitance ($\chi_N$) from the node to other nodes and to ground divided by the sum of conductance ($\gamma_N$) from the node to other nodes and to ground. Each node of a circuit is classified as a quick, slow, or normal node according to whether its time constant is less than, greater than, or between the minimum and maximum time constants defining the frequency range of interest. Sheehan concluded that quick nodes can be eliminated from the circuit network without significantly altering its behavior (such as delay characteristics or more specifically the Elmore delay) in the frequency range of interest.

Sheehan then presented a time constant equilibration reduction (TICER) algorithm that reduces an RC circuit by successively finding quick nodes in the circuit and then eliminating them by the following procedures. To eliminate a quick node N, first remove all resistors and capacitors connecting other nodes to node N. Then insert new resistors and capacitors between former neighbors of node N according to the following two rules. If node i and node j had been connected to node N through conductance $g_{iN}$ and $g_{jN}$, insert a conductance $g_{iN}g_{jN}/\gamma_N$ between nodes i and j. If node i had a capacitor $C_{iN}$ connected to node N and node j had a conductance $g_{jN}$ connected to node N, insert a capacitor $C_{iN}g_{jN}/\gamma_N$ between nodes i and j. A drawback of the TICER algorithm is that it only focuses on controlling the accuracy of circuit simulation and ignores the topological impact of node eliminations. This is because although TICER reduces the number of nodes, it may increase the number of resistors or capacitors between nodes neighboring the eliminated nodes. The increased number of resistors or capacitors could further complicate the entanglement between the remaining nodes. To further illustrate TICER's drawback, consider an example shown in FIG. 1. FIG. 1 shows a circuit fragment (or a "regional" circuit topology) comprising a quick node N having four neighboring nodes 1–4 connected to node N through four resistors with conductance $g_{1N} \ldots g_{4N}$. Eliminating node N according to TICER produces six new conductance connected between the four neighboring nodes. In general, eliminating a quick (or slow) node having M neighboring nodes could produce M(M−1)/2 new resistors or capacitors between the neighboring nodes. These new resistors or capacitors could further aggravate the subsequent circuit analysis. As a result, TICER may not achieve significant circuit reduction for large circuit networks There is therefore a need to provide a method of producing a reduced topology that takes into account both the physical and topological characteristics of the circuit network. There is also a need to provide a system that implements the above method.

SUMMARY OF INVENTION

The present invention includes a method of transforming a first topology to a reduced topology, said first topology representing an abstraction of one or more objects, said first topology further comprising a plurality of inter-connected elements. The method comprises the steps of: (a) identifying one or more elements for reduction; (b) analyzing the effect of reducing one or more of said identified elements on the topological and physical characteristics of said one or more objects, and (c) if the effect is negligible, generating a second topology reflecting the reduction of one or more identified elements.

The present invention also includes a method of transforming a circuit from a first topology to a reduced topology, said first topology comprising a plurality of inter-connected circuit elements. The method comprises the steps of: (a) identifying one or more circuit elements; (b) analyzing the effect of reducing one or more of said identified circuit elements on the topological and physical characteristics of said circuit; and (c) if the effect satisfies a first standard, generating a second topology reflecting the reduction of one or more identified circuit elements. Steps (a)–(c) of the above methods may be recursively executed until no further reduction is possible.

The present invention further includes a system for transforming a first topology to a reduced topology, said first topology representing an abstraction of one or more objects, said first topology further comprising a plurality of inter-connected elements. The system comprises one or more software objects configured to (a) identify one or more elements; (b) analyze the effect of reducing one or more of said identified elements on the topological and physical characteristics of said one or more objects, or (c) generate a second topology reflecting the reduction of one or more identified elements, if the effect is negligible. Such system may further comprise one or more software objects configured to recursively executing (a), (b) and (c) until no further reduction is possible.

The present invention further includes a method of reducing coupling capacitors within a circuit topology. The method comprises the steps of: identifying one or more C-blocks; producing a first regional topology approximating the effect of eliminating one or more of said C-blocks; estimating the coupling effects of one or more crossly-coupled nodes in the first regional topology; and generating a second regional topology replacing the cross-coupling of one or more crossly-coupled nodes with their corresponding estimated coupling effects.

The present invention further includes a method of transforming a circuit from a first topology to a reduced topology, said first topology comprising a plurality of inter-connected circuit elements. The method comprises the steps of: generating a tree-like topological approximation of at least one partition of the first topology; identifying one or more circuit elements for reduction from the tree-like topological approximation; and reducing one or more of said circuit elements in a bottom-up fashion from the leaf nodes to the root of the tree-like topological approximation.

BRIEF DESCRIPTION OF DRAWINGS

FIGS. 4A–4C illustrates the TICER algorithm using an example circuit fragment having a coupling capacitor $C_1$ connected between two series of resistors $R_1$ $R_2$ and $R_3$ $R_4$.

FIG. 18 illustrates one embodiment of a method of reducing nodes.

FIG. 19 illustrates one embodiment of a method of reducing capacitors.

DETAILED DESCRIPTION OF PREFERRED EMBODIMENTS

One embodiment of the present invention comprises a method of transforming a first topology to a reduced topology. The first topology may represent an abstraction of one or more objects. The one or more objects can be circuits or any other objects. The first topology may further comprise a plurality of inter-connected elements. These inter-connected elements can be circuit elements, such as nodes, capacitors, transistors, or any other elements. The reduced topology may be obtained by eliminating elements or making approximations.

Figure 1:
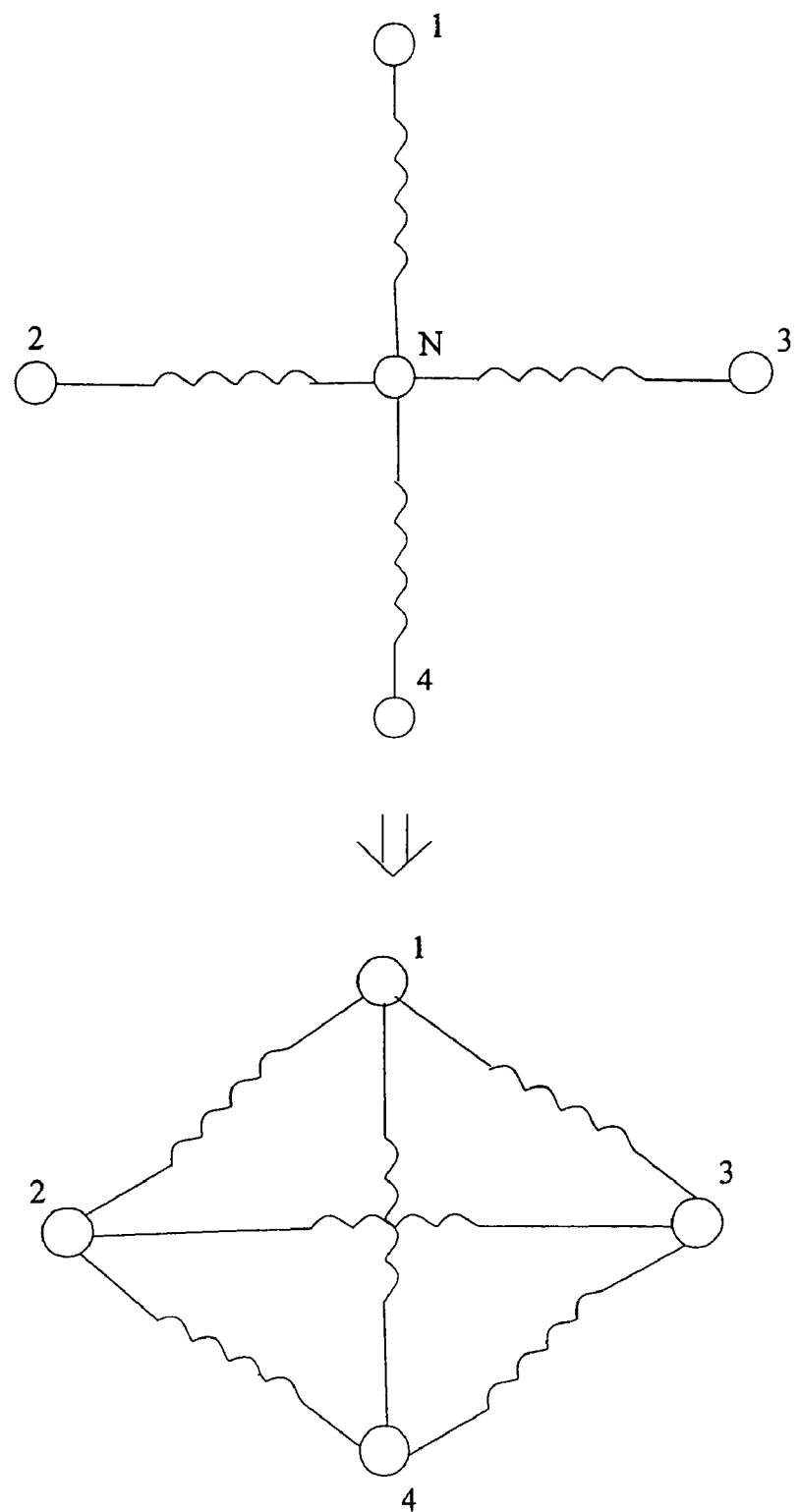
FIG. 1 illustrates an example circuit topology before and after node elimination according to the TICER algorithm.
Figure 2:
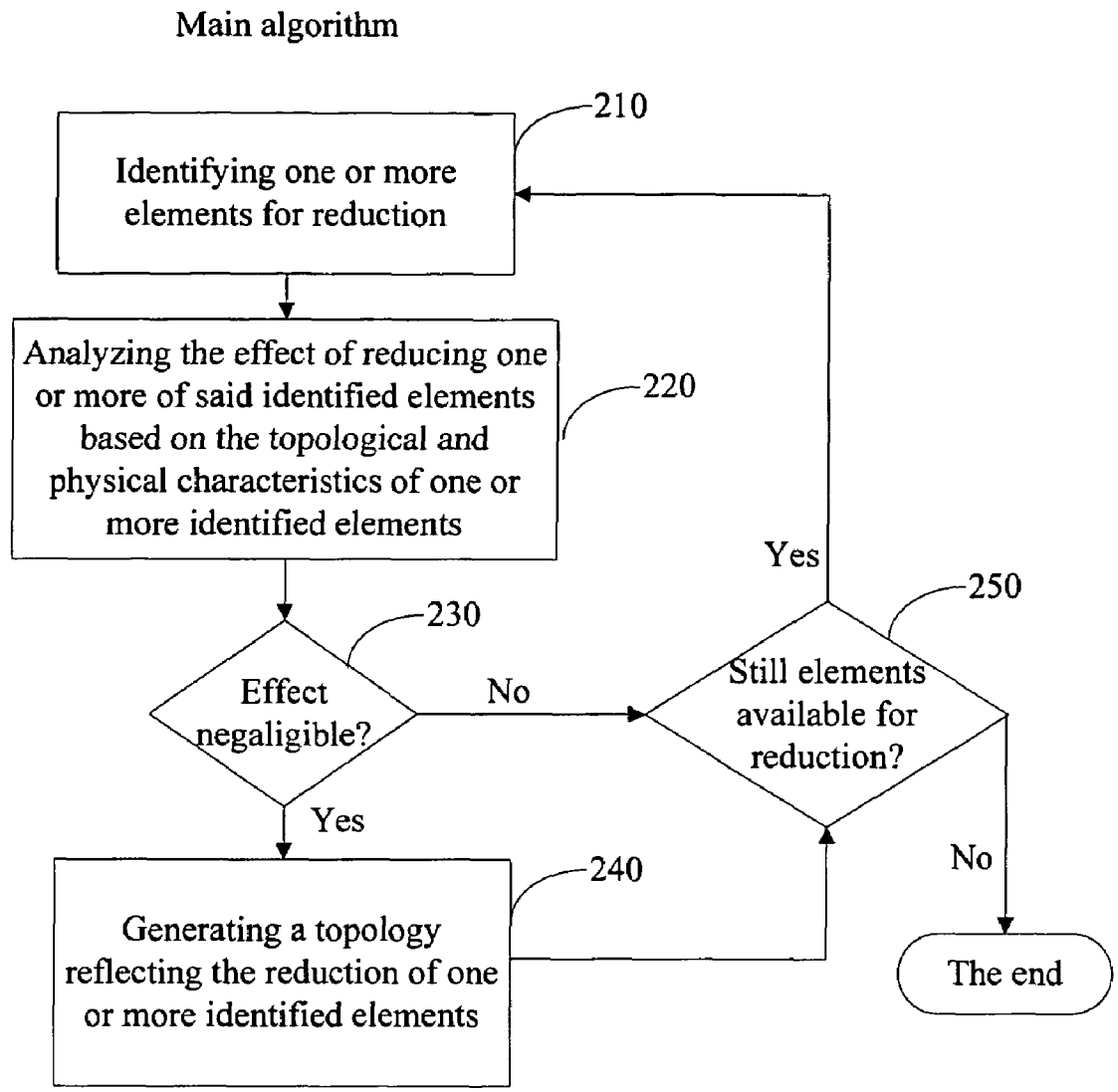
FIG. 2 is a flow chart of one embodiment of the present invention.

A flow chart of one method of the present invention is shown in FIG. 2. Step 210 of the method identifies one or more elements for reduction. The one or more elements for reduction can be identified according to any applicable topological or physical standard. In one embodiment, symmetric nodes on the topology may be identified since these nodes may represent points or parts of the objects having similar behavior. Approximations of the first topology may be produced to facilitate the identification of elements for reduction. The approximation may be a minimum spanning tree (MST) of the first topology, or any other forms.

In step 220, the effect of reducing one or more of said identified elements is analyzed based on the topological and physical characteristics of said identified elements. The physical characteristics may include delay characteristics for circuit elements, or other characteristics for other objects. The topological characteristics may include connectivity of elements, topological complexity, or other characteristics.

In step 230, the method determines if the effect is negligible. The standard for determining the negligibility of the physical and topological effect may include any user-defined standard. For circuit networks, changes in physical effects, such as delay characteristics like Elmore delays are considered to be negligible if they are less than a certain percentage of the total delay. The topological effect may be determined by analyzing the complexity of topological approximations or equivalent topologies reflecting the reduction of one or more identified elements. For circuit networks, the topological effect may be considered to be negligible if it does not increase the complexity of the circuit topology. If the effect is determined to be negligible in step 230, the method proceeds to step 240.

In step 240, the method generates a second topology reflecting the reduction of one or more of the identified elements if it is determined that the effect is negligible. The second topology may be a reduced topology, or it may be a topology that facilitates further reduction. For example, a reduced topology may be generated by merging symmetric nodes. In one embodiment, steps 210–240 are executed recursively until no further reduction is possible. In another embodiment, the method may be executed again with more relaxed negligibility standards.

In one embodiment, step 210 comprises the step of producing a minimum spanning tree (MST) of the first topology, if the first topology is not a tree. The MST can be generated using any standard MST algorithm. In one embodiment, the MST is generated using the Prim's algorithm. A complete description of the Prim's algorithm and other MST algorithms can be found in M. A. Weiss, "Data Structures and Algorithm Analysis in C", $2^{nd}$ edition, Addison-Wesley 1997, the contents of which are incorporated hereby in its entirety as reference.

For circuit networks, one or more input ports or drivers may be selected as the root nodes of the MST, or the first topology if it is a tree. In one embodiment, the MST or the first topology may be further divided into subtrees based on the root nodes. Some further approximations may be performed on the circuit topology before or after generating the MST. For example, several circuit elements may be merged into a macro-node in order to simplify the analysis. In one embodiment, a macro-node is a maximal subcircuit with either a tree or a mesh structure. Furthermore, macro-nodes may be formed in such a way that they are connected in a tree manner. In another embodiment, the circuit network is first partitioned into one or more sub-nets. These one or more sub-nets may include one or more "DC nets". A DC net is a sub-net that is connected via capacitors to other neighboring sub-nets. More specifically, the following conditions may be used to identify a DC net. First, the DC net may include a node N, if there is at least one path of resistors from a root node to node N. The root node may be any node in the DC net. In one embodiment, a driver in the DC net is selected as a root node. Secondly, if a node N satisfies the first condition, then all ground capacitors connected to node N, as well as all resistors on any path from the root node to node N, are also included in the DC net.

In another embodiment of the present invention, small-valued circuit elements are reduced from the circuit topology. For example, a resistor may be considered to be small-valued if its resistance is less than a threshold, such as 0.001 Ω, 0.01 Ω, or 0.1 Ω. A capacitor may be considered to be small-valued if its capacitance is less than 0.1 fF, 1 fF, or 10 fF. Eliminating small-valued circuit elements is relatively safe because most of the time it only negligibly affects the physical characteristics of the circuit. But, care must be taken in the elimination process to avoid further complicating the circuit topology.

Figure 3:
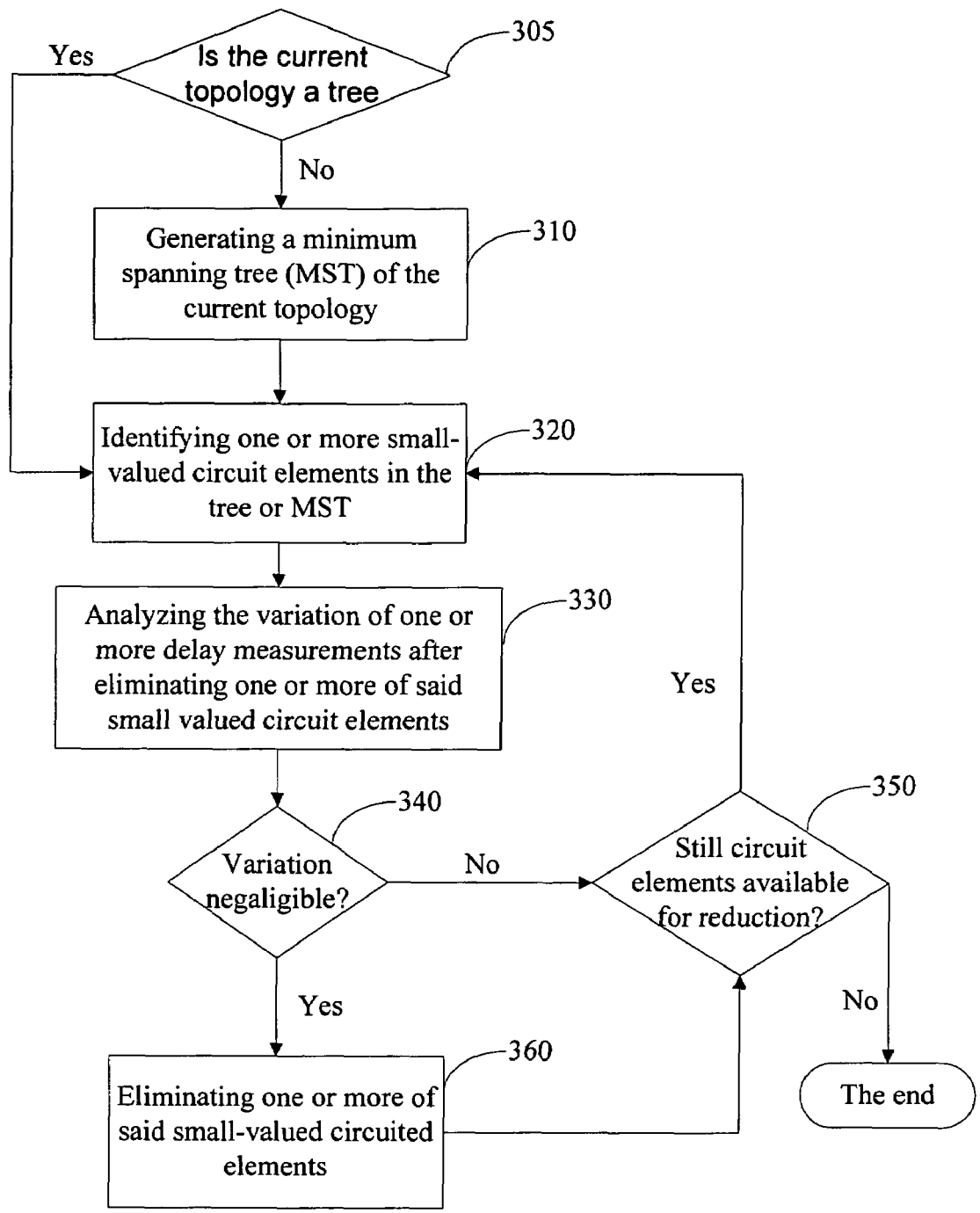
FIG. 3 is a flow chart of another embodiment of the present invention.

A flow chart of one embodiment of the method of reducing small-valued circuit elements from the circuit topology is shown in FIG. 3. Step 305 determines if the current circuit topology is a tree. If it is a tree, the method proceeds to step 320. If the current topology is not a tree, a MST of the current circuit topology is generated in step 310. In step 320, one or more small-valued circuit elements are identified from the tree or the MST. Eliminating these circuit elements may be safe because nodes connected to these circuit elements are likely to be quick nodes. Step 330 analyzes the variation of one or more delay measurements. This step further guarantees that the identified circuit elements can be eliminated without significantly altering the physical characteristics of the original circuit. Sheehan's formulae, for example, may be used in this step to estimate the change of Elmore delay after eliminating the identified circuit elements. Step 340 determines whether the variation is negligible. If it is negligible, step 360 eliminates those identified small-valued circuit elements. Step 350 determines whether there are any circuit elements remaining to be reduced. If so, control returns to step 320. In this manner, small-valued circuit elements can be recursively identified and eliminated from the tree or the MST until no more circuit element is available for reduction.

Yet another embodiment of the present invention comprises methods of reducing circuit elements, such as capacitors, that have coupling effects. Such coupling capacitors often exists between two series of resistors. Reducing these coupling capacitors can greatly simplify the circuit topology because it enables the series of resistors to be combined, thereby achieving further circuit reduction. FIG. 4A illustrates an exemplary portion of a circuit fragment having a coupling capacitor $C_1$ connected between two series of resistors $R_1$ $R_2$ and $R_3$ $R_4$.

The prior art TICER algorithm cannot eliminate a coupling capacitor without further complicating the circuit topology. As an example, consider the circuit fragment shown in FIG. 4A. Applying the TICER algorithm, eliminating $C_1$ involves eliminating nodes a and b. As shown in FIG. 4B, according to TICER, two cross-coupling capacitors $C_{1b}$ and $C_{2b}$ are created after eliminating node a. Moreover, as shown in FIG. 4C, two cross-coupling capacitors $C_{23}$ and $C_{14}$ are created following the elimination of node b. The creation of these two cross-coupling capacitors is undesirable since it further complicates the entanglement of circuit elements.

Figure 6:
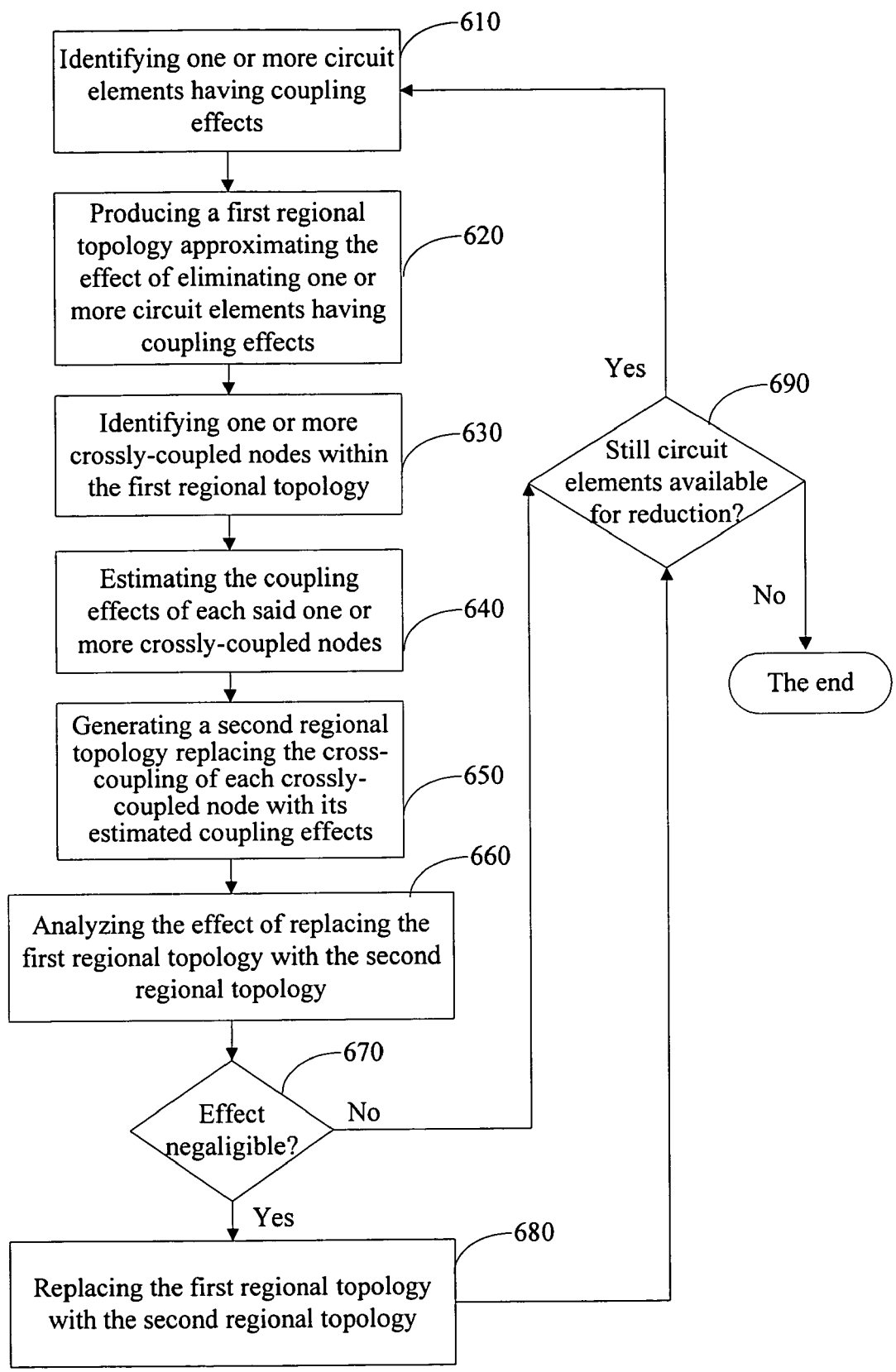
FIG. 6 is a flow chart of yet another embodiment of the present invention.

One embodiment of the present invention comprises a method of reducing the coupling effect of a circuit without creating any cross-coupling circuit elements. A flow chart of one embodiment of this method is shown in FIG. 6. Step 610 identifies one or more circuit elements, such as coupling capacitors, having coupling effects. Step 620 produces a first regional topology approximating the effect of eliminating one or more circuit elements having a coupling effect. The first regional topology may be produced using any suitable mathematical or topological method. In one embodiment, coupling capacitors are reduced "C-block" wise. A C-block is a set of nodes connected via coupling capacitors. For example, nodes a, b in FIG. 6 form a C-block. To eliminate the coupling capacitors connected between nodes in a C-block, nodes in the C-block are eliminated one after the other. The TICER algorithm may be used to approximate the effect of node elimination in a C-block. Step 630 identifies one or more crossly-coupled nodes (such as capacitors $C_{14}$ and $C_{23}$ in FIG. 4C) within the first regional topology. Step 640 estimates the coupling effects of each said one or more crossly-coupled nodes. The coupling effect of these crossly-coupled nodes can be estimated based on the value of the capacitors in the first regional topology connected to the one or more crossly-coupled nodes. One way of estimating the coupling effect is described in the paragraph below. Step 650 generates a second regional topology by replacing the cross-coupling of each crossly-coupled node with its estimated coupling effects. Step 660 analyzes the effect of replacing the first regional topology with the second regional topology. The effect can be determined, for example, based on the change of delay characteristics of other circuit elements. Step 670 determines whether the effect is negligible. If it is negligible, step 680 replaces the first regional topology with the second regional topology. Step 690 determines whether there are any circuit elements remaining to be reduced. If so, control returns to step 610.

Figure 5A:
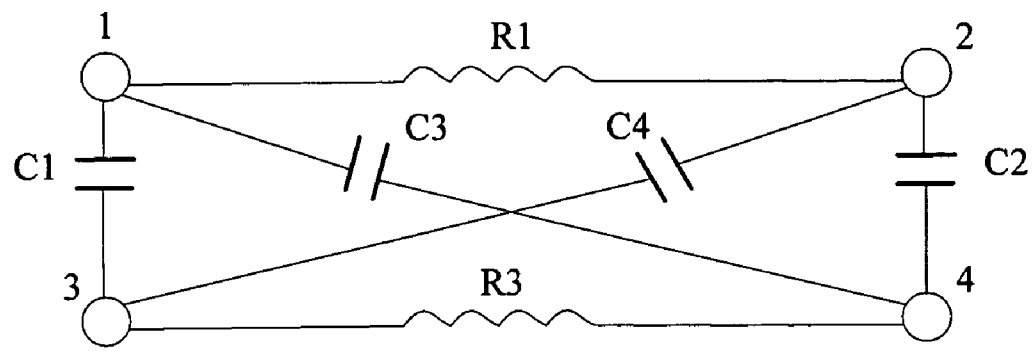
FIGS. 5A–5B illustrates one way of estimating the coupling effect based on FIG. 4C's circuit.
Figure 5B:
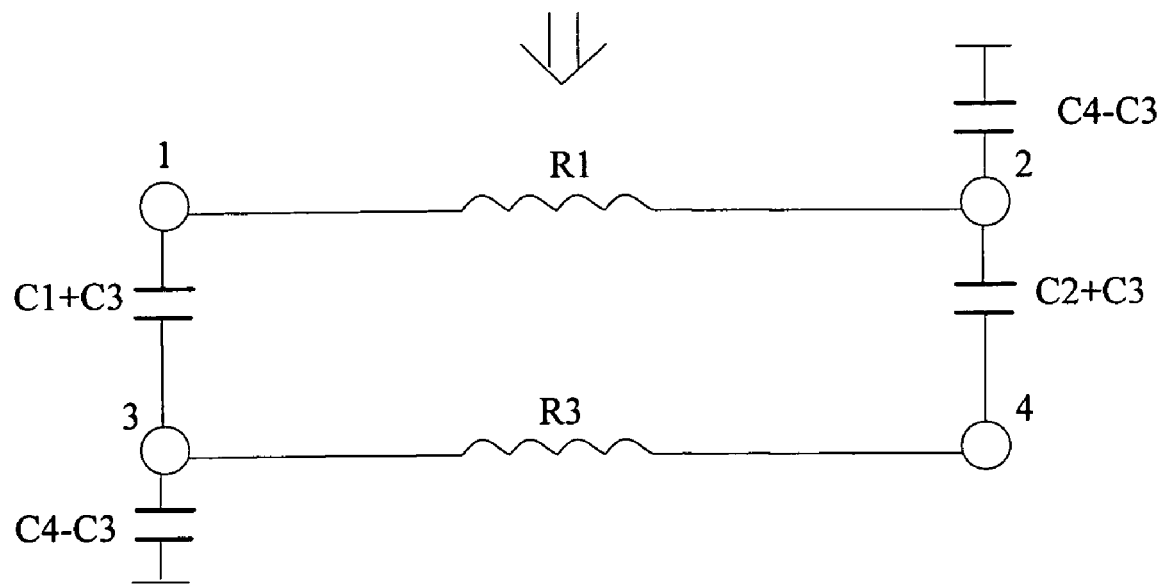

FIG. 5 illustrates one way of estimating the coupling effect. FIG. 5's first regional topology contains four nodes 1–4 with coupling capacitors $C_1$, $C_2$ and cross-coupling capacitors $C_3$, $C_4$. The coupling effect of each node is estimated as follows. Let $C_{min}$ be the minimum value between capacitance $C_3$ and $C_4$. For simplicity, assuming $C_{min}=C_3$, i.e. we assume $C_3 \leq C_4$ in FIG. 5's circuit. Also let $\Delta C$ be the absolute value of the difference between $C_3$ and $C_4$. It is then estimated that the coupling effect of node 1 be a capacitance $C_1+C_3$ connected between nodes 1 and 3. The coupling effect of node 3 is estimated to be a capacitance $C_1+C_3$ connected between nodes 1 and 3 plus a capacitance $\Delta C$ connected between node 3 and the ground. Likewise, the coupling effect of node 4 is estimated to be a capacitance $C_2+C_3$ connected between nodes 2 and 4. The coupling effect of node $N_2$ is estimated to be a capacitance $C_2+C_3$ connected between nodes 2 and 4 plus a capacitance $\Delta C$ connected between node 2 and the ground. After estimating the coupling effects, the second regional topology is generated by replacing capacitors $C_1-C_4$ with the coupling effect of nodes 1–4 as estimated above.

Figure 7A:
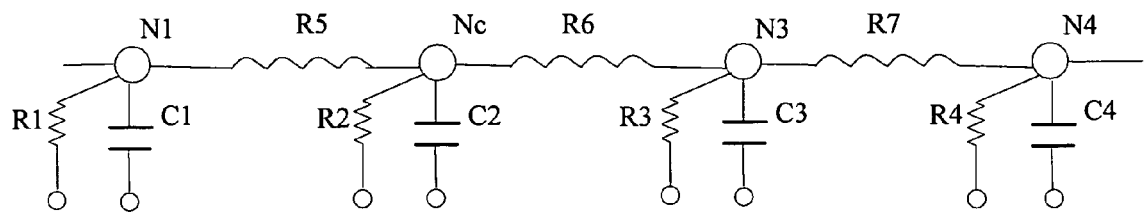
FIGS. 7A–7B illustrates one embodiment of a method of reducing a cluster.

In another embodiment of the present invention clusters of circuit elements are reduced from the circuit topology. A cluster typically comprises a series of resistors along with their end nodes and their surrounding circuit elements. Each of the surrounding circuit elements may connect between one node within the series of resistors and another node not within the series of resistors. FIG. 7A shows an example cluster having a series of resistors $R_5-R_7$, four end nodes $N_1$, $N_c$, $N_3$, $N_4$ and surrounding elements including capacitors $C_1-C_4$ and resistors $R_1-R_4$. Clusters can be identified directly from the circuit topology or from the MST of the circuit topology. In one embodiment, clusters are identified in a bottom-up fashion from the MST. Clusters can be used to model memory blocks in a circuit and thus may appear in large numbers in circuit models representing micro-processor chips. Reducing clusters, therefore, can be beneficial at least to the subsequent analysis of micro-processor circuits.

Figure 8:
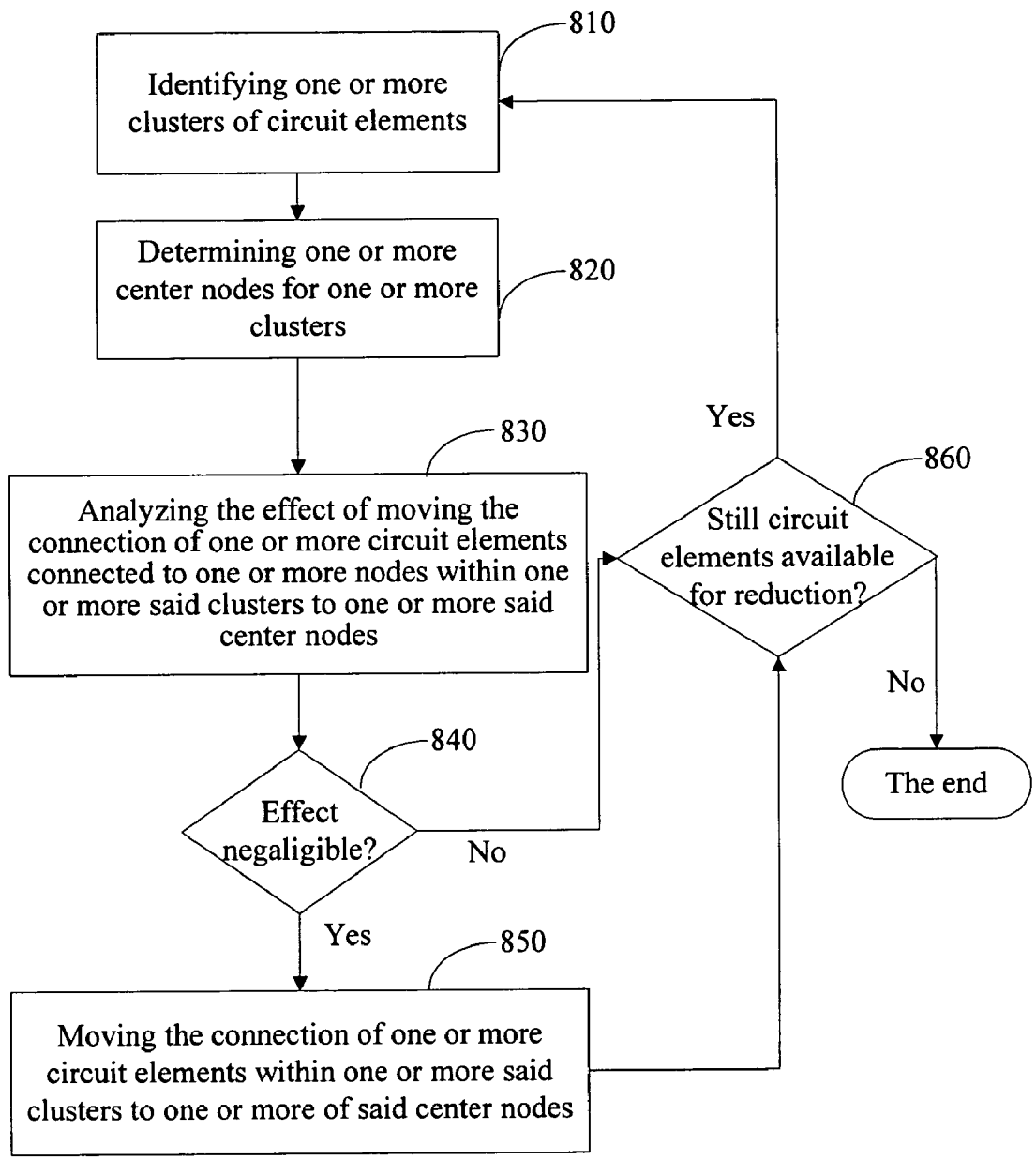
FIG. 8 is a flow chart of another embodiment of the present invention.

A flow chart of one embodiment of the method of reducing clusters is shown in FIG. 8. Step 810 identifies one or more clusters for reduction. Step 820 determines one or more center nodes for one or more clusters. A center node can be the topological center of the cluster, or it can be selected based on the value of resistors on its right or left hand side in the cluster, or, it can be any arbitrarily defined center node. Step 830 analyzes the effect of moving the connection of one or more circuit elements connected to one or more nodes within one or more said clusters to one or more said center nodes. The effect can be determined, for example, based on the change of delay characteristics of other circuit elements. Step 840 determines whether the effect is negligible. If it is negligible, step 850 moves the connection of one or more circuit elements within one or more said clusters to one or more said center nodes. Step 860 determines whether there are any circuit elements remaining to be reduced. If so, control returns to step 810.

Figure 7B:
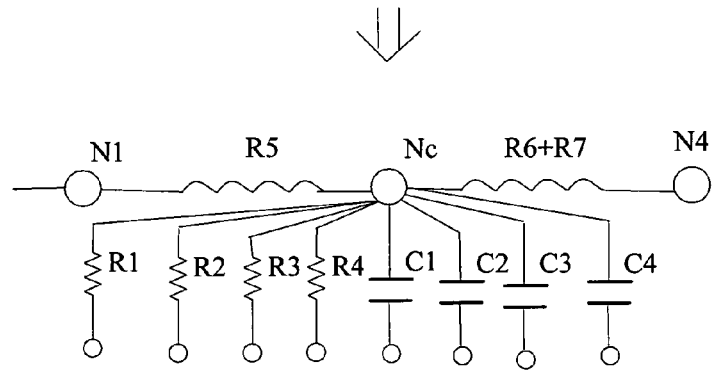

The above method is further illustrated using FIG. 7A's circuit. In FIG. 7A's cluster, a center node $N_c$ is first determined. After $N_c$ is determined, the connection of capacitors $C_1-C_4$ and resistors $R_1-R_7$ are moved to $N_c$ as shown in FIG. 7B. Resistors $R_6$ and $R_7$ are also merged. Furthermore, resistor $R_1-R_4$ and capacitors $C_1-C_4$ can also be merged in many cases. For example, if resistors $R_1-R_4$ or capacitors $C_1-C_4$ are connected to a common node outside the cluster, these resistors or capacitors can be merged into one resistor or capacitor. In general, the effect of the above transformation on the Elmore delay is minimized when all resistors within the series of resistors are small-valued. However, when the cluster is connected between two transistors, the effect can still be negligible even if some or all resistors within the series of resistors are not small-valued.

Figure 9:
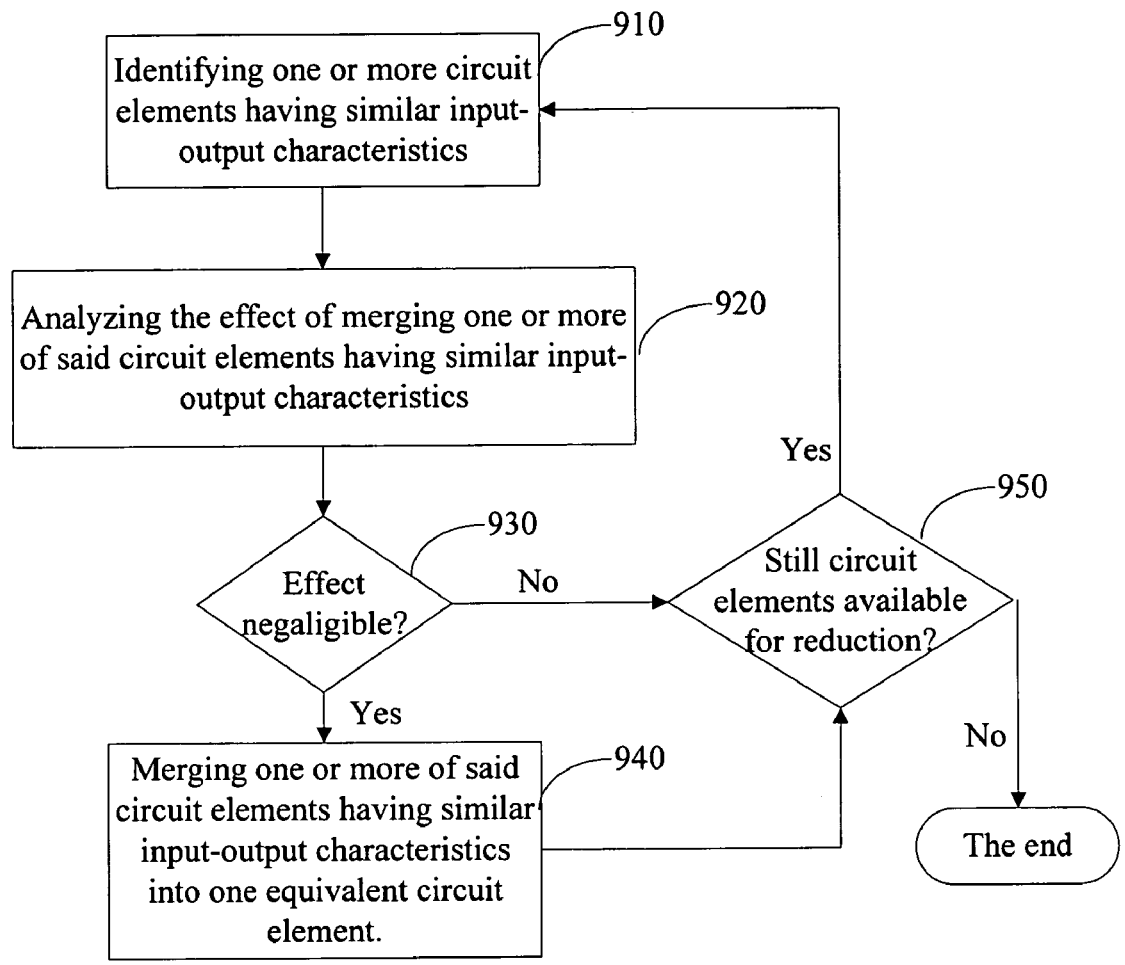
FIG. 9 is a flow chart of another embodiment of the present invention.

Yet another embodiment of the present invention comprises methods for node reduction within a circuit topology. FIG. 9 depicts a flow chart of this embodiment. In step 910, one or more nodes having similar input-output characteristics, such as similar input-output voltage or current, are first identified. In step 920, the effect of merging one or more of these nodes, such as the effect on the Elmore delay, is then analyzed. Step 930 determines if the effect is negligible. If so, step 940 merges one or more of these nodes into one node. Step 950 determines whether there are any circuit elements remaining to be reduced. If so, control returns to step 910.

Figure 10:
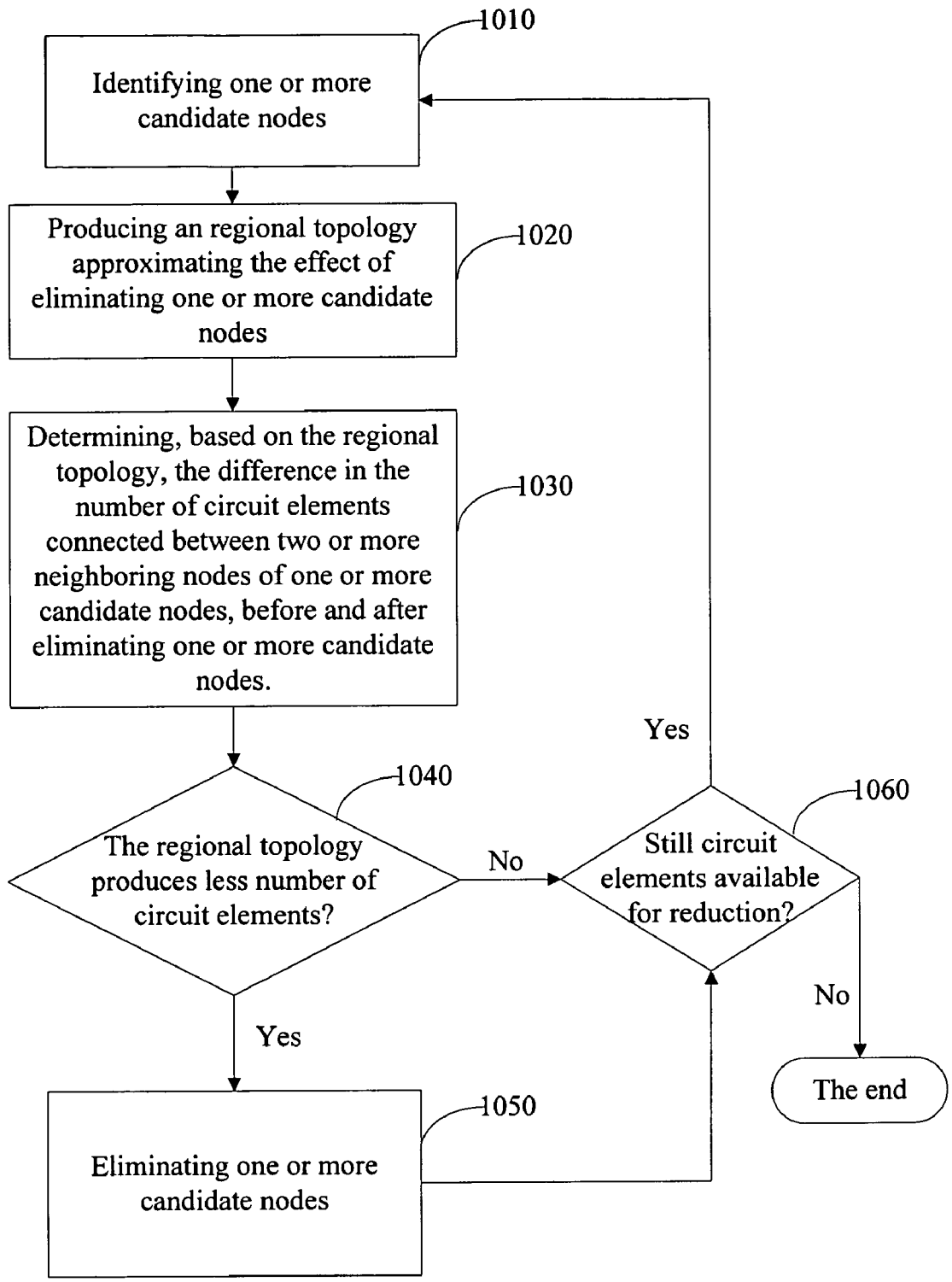
FIG. 10 is a flow chart of another embodiment of the present invention.

In another embodiment of node reduction methods, one or more candidate nodes are first identified. These candidate nodes are likely to be quick nodes according to TICER and may therefore be safely eliminated without affecting the delay characteristics of the circuit network. However, care must be taken in applying TICER's node elimination rules to avoid further complicating the circuit topology. The following rules may be applied to ensure a reduced topology after eliminating one or more candidate nodes. The general rule is that one or more candidate nodes can be eliminated only if eliminating them produces a less number of circuit elements connected between their neighboring nodes. FIG. 10 depicts a flow chart of one embodiment applying the general rule. In step 1010, one or more candidate nodes are identified. Step 1020 produces a regional topology approximating the elimination of one or more candidate nodes. The TICER algorithm, for example, may be used to produce such an approximation. Step 1030 determines, based on the regional topology produced in step 1020, the difference in the number of circuit elements connected between the neighboring nodes of one or more candidate nodes, before and after eliminating one or more candidate nodes. Step 1040 determines if the regional topology produces less number of circuit elements. If so, step 1050 eliminates the one or more candidate nodes. Step 1060 determines whether there are any circuit elements remaining to be reduced. If so, control returns to step 1010.

Figure 11:
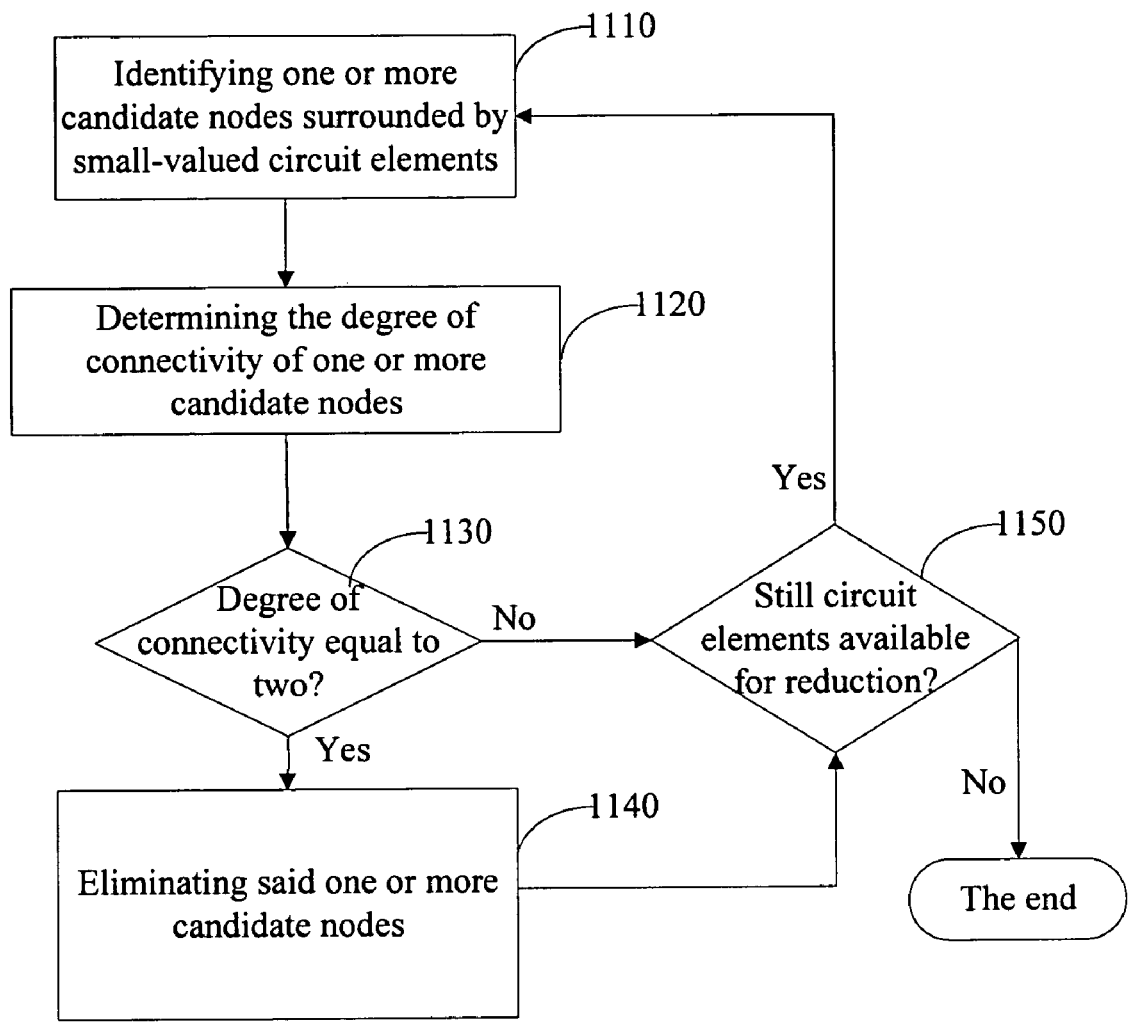
FIG. 11 is a flow chart of another embodiment of the present invention.

Besides the general rule, several more specific rules may also be applied to facilitate the node elimination. First, a quick node $N_c$ can be eliminated if its degree of connectivity is equal to two, i.e. there are only two resistors (and therefore only two neighboring nodes) connected to $N_c$. Applying TICER's rules, eliminating $N_c$ only produces an equivalent resistor connected between the two nodes neighboring $N_c$. These quick nodes may be eliminated at the beginning of the reduction process so that small resistors connected to these nodes are first merged instead of being shorted. FIG. 11 depicts a flow chart of one embodiment of the first rule. In step 1110, one or more candidate nodes are identified. These one or more candidate nodes may be quick nodes or other nodes of interest. Step 1120 determines the degree of connectivity of one or more candidate nodes. Step 1130 determines if the degree of connectivity is equal to two. If so, step 1140 eliminates the one or more candidate nodes. Step 1150 determines whether there are any circuit elements remaining to be reduced. If so, control returns to step 1110.

Figure 12A:
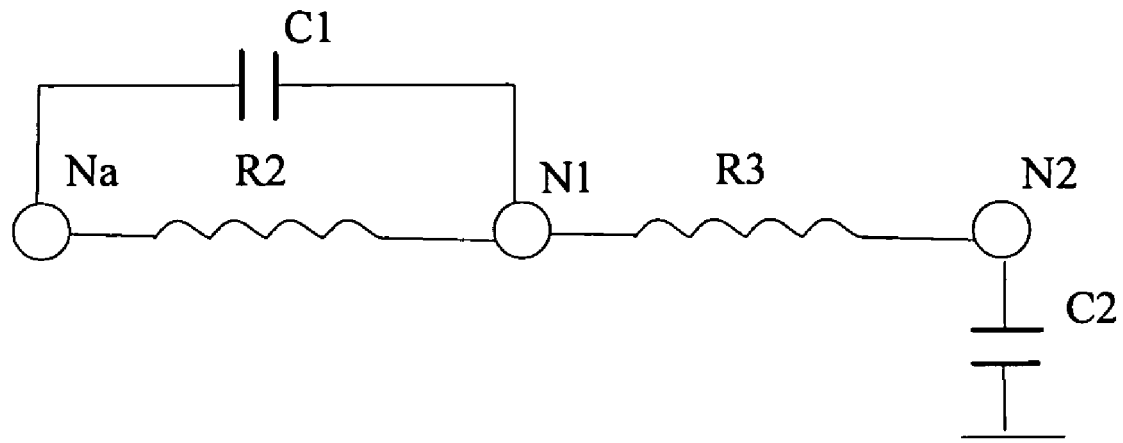
FIGS. 12A–12B illustrate a circuit transformation that results in a voltage divider structure.
Figure 12B:
Figure 12B:
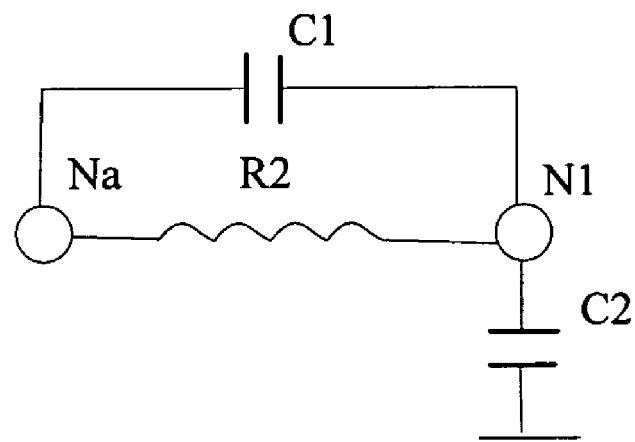
Figure 13:
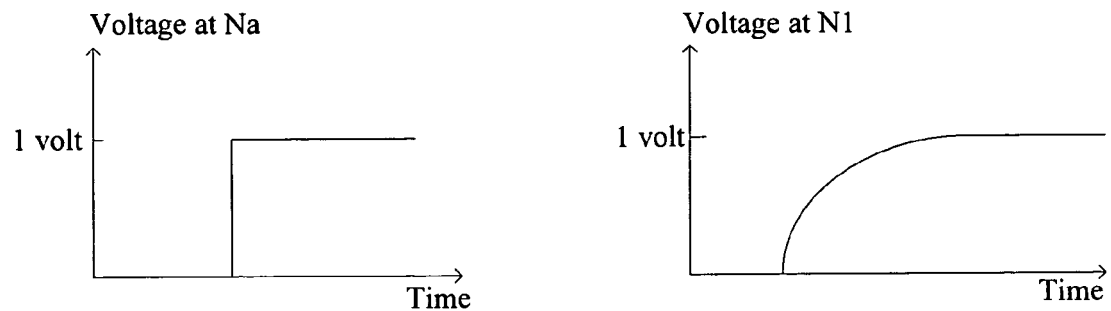
FIG. 13 illustrates the step response of a neighboring node before and after eliminating a node whose degree of connectivity is equal to one.
Figure 13:
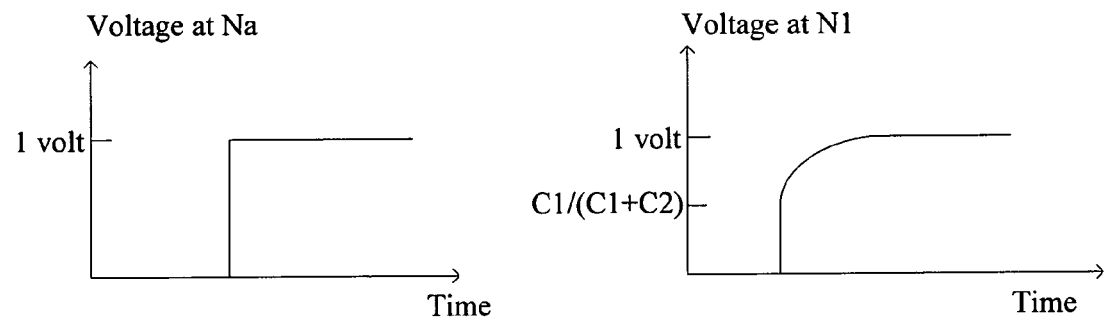

As a second rule, a candidate node whose degree of connectivity is equal to one may be eliminated (by, for example, shorting the resistor connected to the candidate node) only if the topology after the elimination does not contain a voltage divider structure comprising two capacitors connected in series. The reason behind this rule is that voltage divider structure may significantly alter the delay characteristics of the neighboring node. To further illustrate this point, consider the exemplary circuit fragment shown in FIG. 12A. In FIG. 12A's circuit, assuming $R_3$ is a small-valued resistor. Node $N_2$ therefore becomes a candidate node with a connectivity equal to one. The regional circuit topology after eliminating $N_2$ contains a voltage divider structure comprising capacitors $C_1$ and $C_2$, as shown in FIG. 12B. (Note that eliminating $N_1$ can also resulting in a similar voltage divider structure.) Assuming a unit step input is applied between node $N_a$ and the ground, the step responses at the neighboring node $N_1$ before and after eliminating $N_2$ are shown in FIG. 13. It can be seen from FIG. 13 that the voltage divider structure causes a voltage jump of $C_1/(C_1+C_2)$ volt at $N_1$. This voltage jump is often undesirable in the subsequent circuit analysis because it greatly alter the delay characteristics of node $N_1$. Also contained in the second rule is that nodes having capacitors directly connected to the input node of a circuit are kept from elimination. This is because eliminating such a node could generate a capacitor directly connected from the input to an output of the circuit, which will also cause an output voltage jump when an input voltage jumps.

Figure 14:
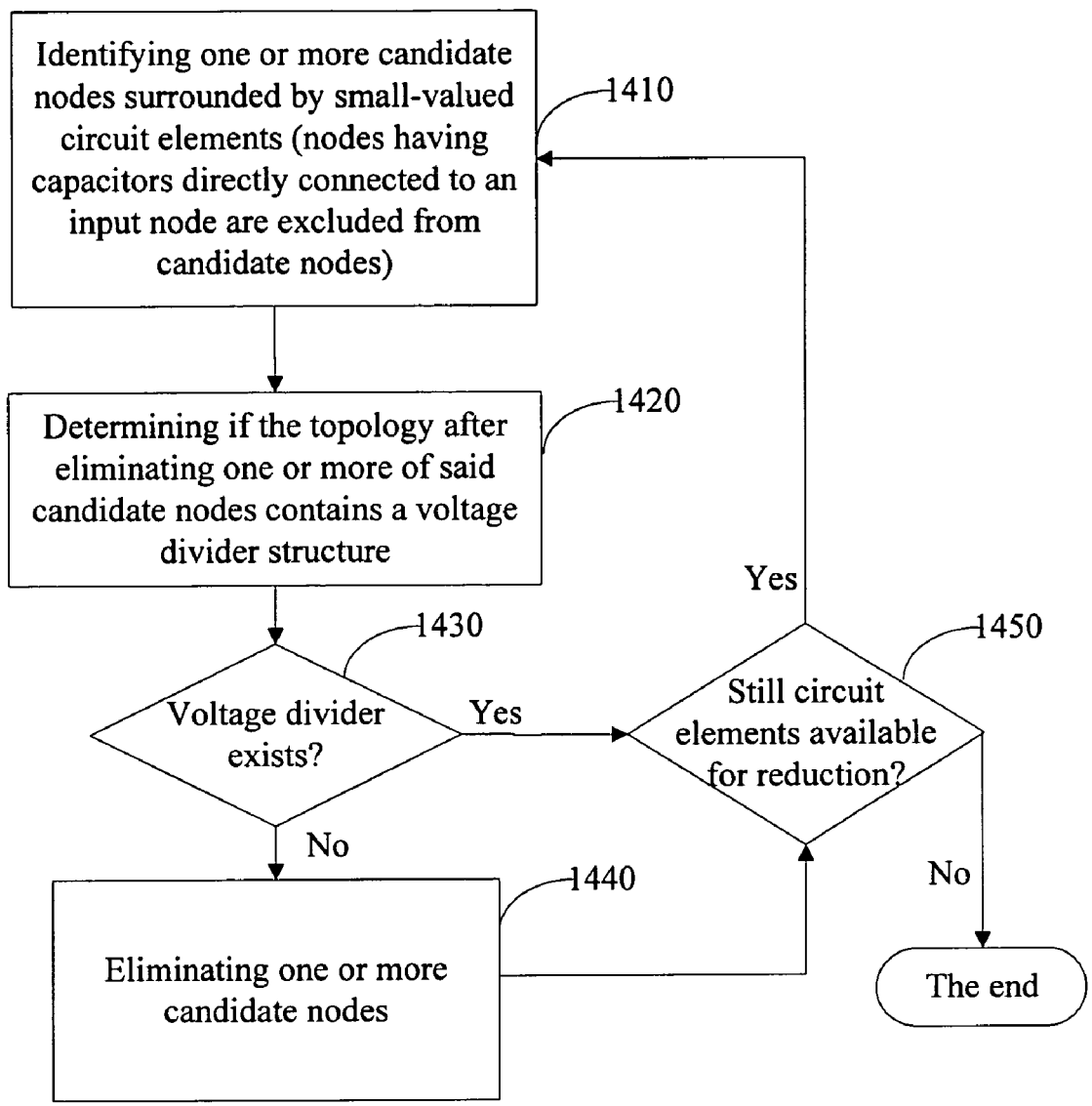
FIG. 14 is a flow chart of another embodiment of the present invention.

FIG. 14 depicts a flow chart of one embodiment of the second rule. In step 1410, one or more candidate nodes are identified. Nodes having capacitors directly connected to the input node of a circuit are excluded from candidate nodes. Step 1420 determines if the topology after eliminating one or more of said candidate nodes contains a voltage divider structure. Step 1430 determines if a voltage divider exists. If so, step 1440 eliminates the one or more candidate nodes. Step 1450 determines whether there are any circuit elements remaining to be reduced. If so, control returns to step 1410.

Figure 15A:
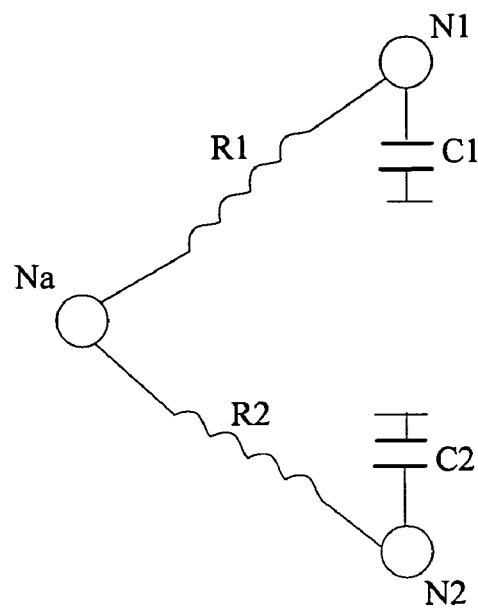
FIG. 15 illustrates a regional topology identified for reduction.
Figure 15B:
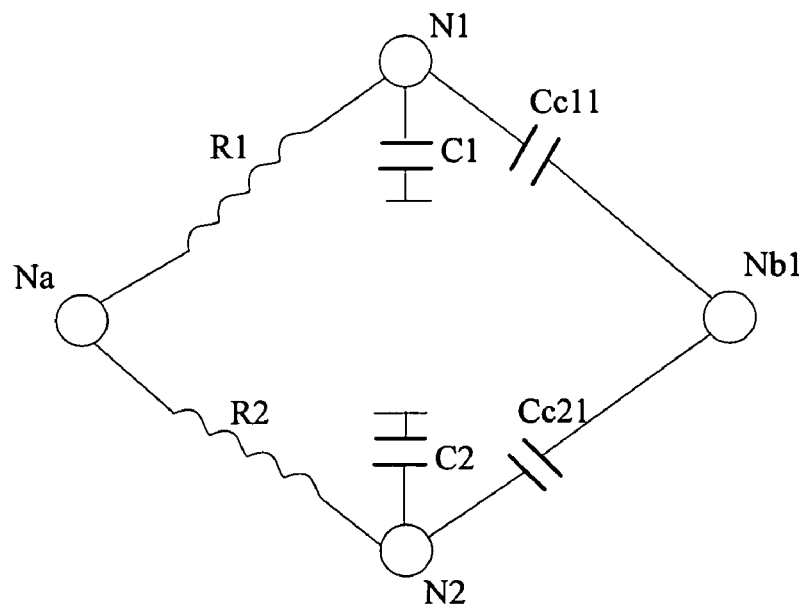

The third rule of node reduction comprises the step of identifying a regional topology comprising two nodes $N_1$ and $N_2$ connected to a common node $N_a$, wherein $N_1$ is connected to $N_a$ through resistance $R_1$, $N_2$ is connected to $N_a$ through resistance $R_2$, $N_1$ and $N_2$ further having capacitors $C_1$ and $C_2$, respectively, connected to either the ground or another common node. Moreover, there may not be other resistor connections to $N_1$ or N2. Furthermore, there may not be additional capacitor connections to $N_1$ or N2 either. An example of such a regional topology is depicted in FIG. 15A. Experiments show that nodes $N_1$ and $N_2$ can be merged without significantly affecting the delay characteristics of the circuit network if the value of $R_1*C_1$ is approximately equal to the value of $R_2*C_2$. Furthermore, if $N_1$ and $N_2$ are further coupled to common nodes $N_{b1}$, $N_{b2}$, . . . ,$N_{bn}$ via capacitors $C_{c11}$, $C_{c12}$, . . . $C_{c1n}$ and $C_{c21}$, $C_{c22}$, . . . $C_{c2n}$, respectively, then nodes $N_1$ and N2 can still be merged if the value of $R_1*Cc_{1i}$ is approximately equal to the value of $R_2*Cc_{2i}$, for i=1, . . . ,n. An example of a regional topology where $N_1$ and $N_2$ are further coupled to a common node $N_{b1}$ via capacitors $C_{c11}$ and $Cc_{21}$ is shown in FIG. 15B.

Figure 16:
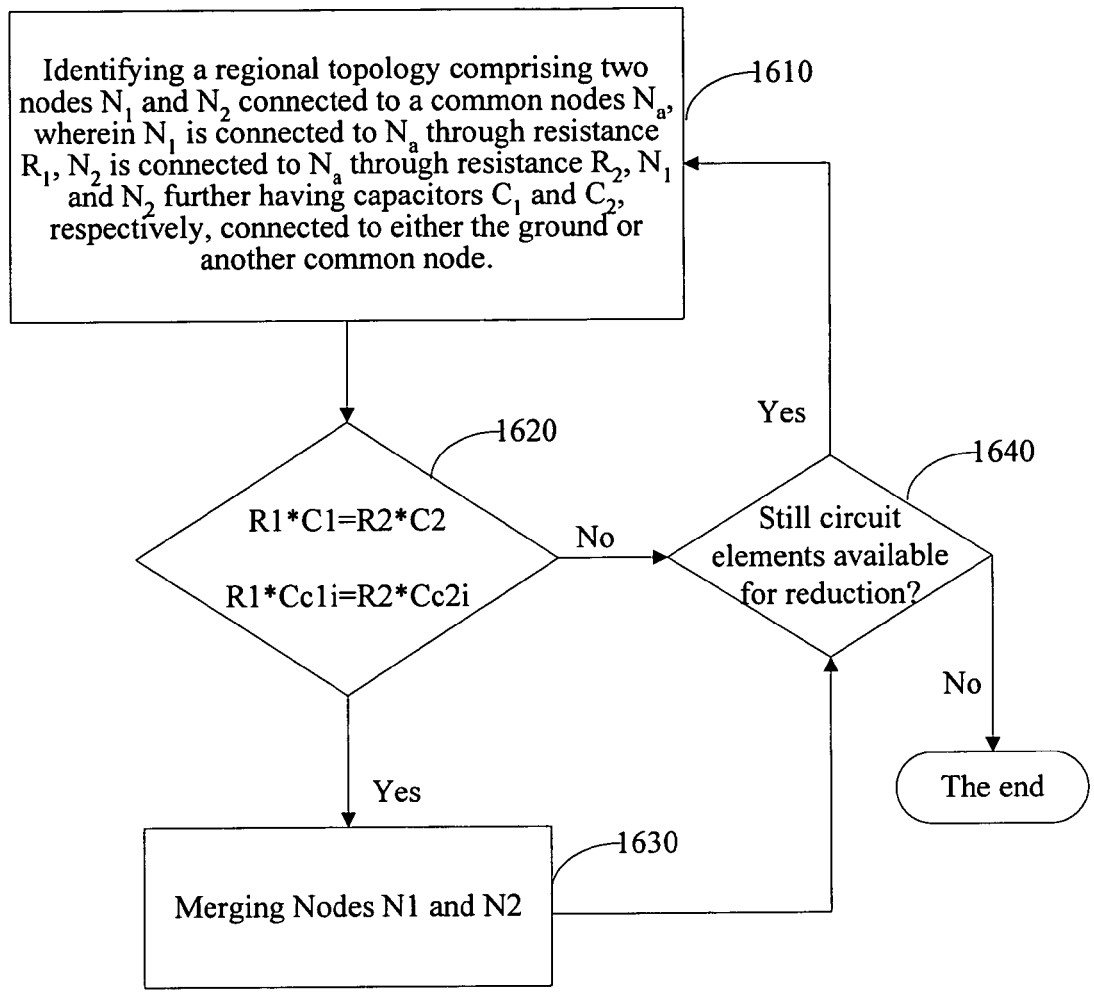
FIG. 16 is a flow chart of yet another embodiment of the present invention.

FIG. 16 depicts a flow chart of one embodiment of the third rule. Step 1610 identifies a regional topology comprising two nodes $N_1$ and $N_2$ connected to a common nodes $N_a$, wherein $N_1$ is connected to $N_a$ through resistance $R_1$, $N_2$ is connected to $N_a$ through resistance $R_2$, $N_1$ and $N_2$ further having capacitors $C_1$ and $C_2$, respectively, connected to either the ground or another common node. Step 1620 determines if the value of $R_1*C_1$ is approximately equal to the value of $R_2*C_2$ and if the value of $R_1*Cc_{1i}$ is approximately equal to the value of $R_2*Cc_{2i}$, if $N_1$ and $N_2$ are connected to additional common nodes. If so, step 1630 merges nodes $N_1$ and $N_2$. Step 1640 determines whether there are any circuit elements remaining to be reduced. If so, control returns to step 1610.

The fourth rule of node reduction comprises the steps of identifying one or more symmetric nodes from a circuit topology comprising a single input tree structure and merging said one or more symmetric nodes if the effect of merging these nodes on the physical characteristics is negligible. The reason behind this rule is that symmetric nodes are likely to exhibit similar behavior. These nodes can therefore be merged without significantly affecting the delay characteristics of the original circuit network. The symmetric nodes can be identified and merged using any applicable algorithms. In one embodiment, the symmetric nodes are identified in a top-down fashion from the first tier to the last tier of the tree.

Figure 17:
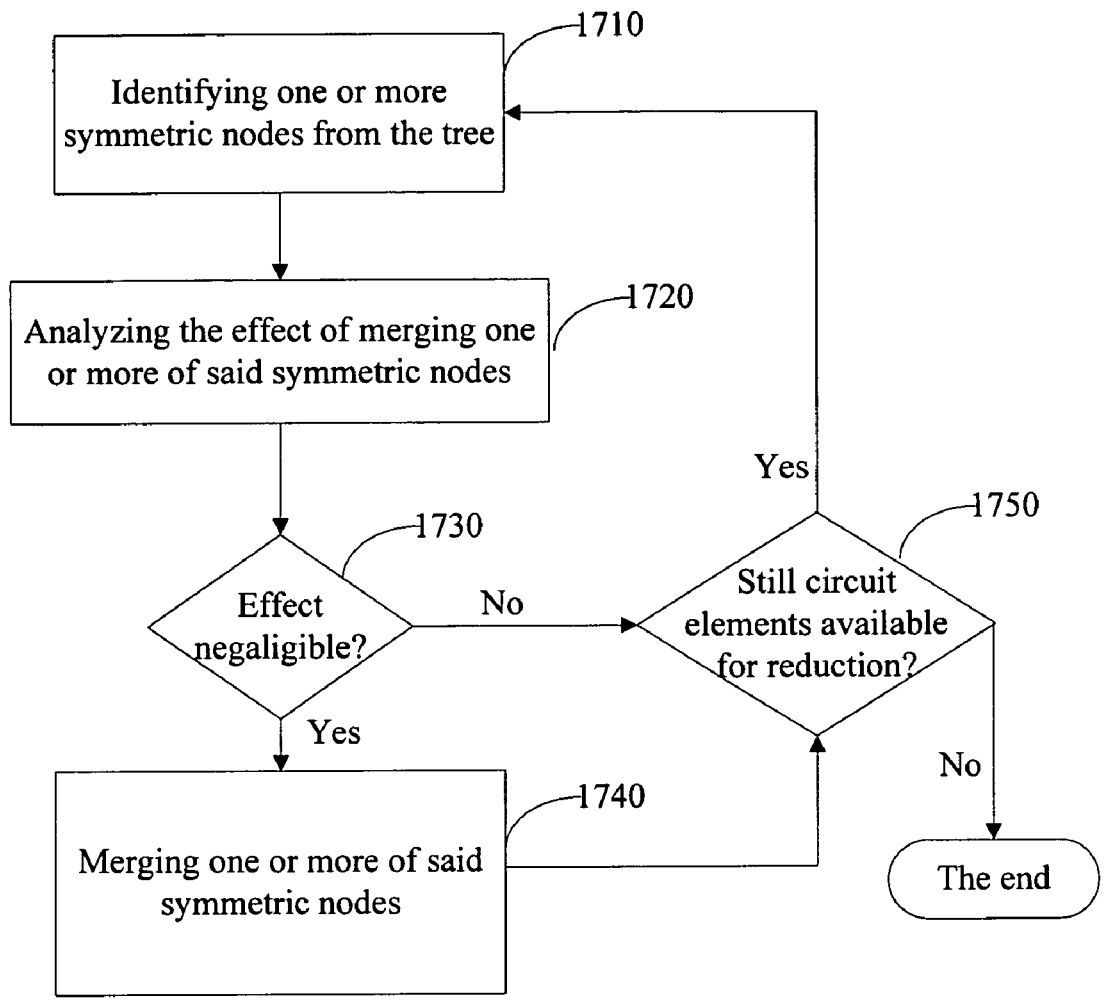
FIG. 17 is a flow chart of yet another embodiment of the present invention.

FIG. 17 depicts a flow chart of one embodiment of the fourth rule. In step 1710, one or more symmetric nodes are identified from a circuit topology comprising a single input tree structure. This circuit topology may be a subcircuit of the original circuit topology. More specifically, in the original topology, a tree structure with multiple inputs ports may be divided into subtrees, each with a single input port. Step 1720 analyzes the effect of merging these nodes on the physical characteristics, such as Elmore delays, of other circuit elements. Step 1730 determines if the effect is negligible. If so, step 1740 eliminates the one or more symmetric nodes. Step 1750 determines whether there are any circuit elements remaining to be reduced. If so, control returns to step 1410.

The fifth rule of node reduction comprises the steps of identifying two nodes $P_1$ and $P_2$ satisfying the following conditions: (i) they are receiver ports with capacitor loads $C_1$ and $C_2$, respectively, (ii) they are connected to a common node A via resistances $R_1$ and $R_2$, respectively, and (iii) both $R_1*C_1$ and $R_2*C_2$ are small; and merging nodes $P_1$ and $P_2$. FIG. 18 depicts one embodiment of the above method. In FIG. 18A, nodes $P_1$ and $P_2$ are identified since they satisfy the above conditions (i)–(iii). In FIG. 18B, nodes $P_1$ and $P_2$ are merged into one node P and their capacitors loads $C_1$ and $C_2$, as well as the two resistors $R_1$ and $R_2$ are combined.

The present invention further comprises methods of reducing capacitors connected between nodes. In one embodiment, a capacitor C connected between nodes A and B are eliminated if it is connected in parallel with a resistor R and the value of $\omega_{max}*C$ ($\omega_{max}$ equals $2\pi$ times the maximum operating frequency of the circuit) is far less then the value of R. In another embodiment, if a transistor drain or source node A is connected to a node B via a small resistor and node A and node B are coupled to node X via capacitors $C_1$ and $C_2$, respectively, then capacitor $C_1$ is moved from between nodes A and X to between nodes B and X and capacitors $C_1$, $C_2$ are then merged into one capacitor. FIG. 19 depicts one embodiment of the above method. In FIG. 19A, node A is the drain node of transistor 1910. If the resistor R connected between nodes A and B is small, then capacitor $C_1$ connected between nodes A and X is merged with capacitor $C_2$ connected between nodes B and X, as shown in FIG. 19B.

Another embodiment of the present invention comprises a computer system including computer software program(s) that implement the above-described methods. The computer system may include a central processing unit (CPU) or other data processing means (e.g., plural processors), and a system memory for storing executable instructions and accessible data for the CPU or other processors. The system memory may take the form of DRAM (dynamic random access memory) and cache SRAM (static random access memory). Other forms of such memory may also be used. A system bus may be used to operatively interconnect the CPU and the system memory.

The computer system may further include non-volatile mass storage means such as a magnetic hard disk drive, a floppy drive, a CD-ROM drive, a re-writeable optical drive, or the like that is operatively coupled to the system bus for transferring instructions and/or data. Instructions for execution by the CPU (or other processors) may be introduced into the computer system by way of computer-readable media such as a floppy diskette or a CD-ROM optical platter or other devices.

The computer system may further include input/output (I/O) means to interface the system bus with peripheral devices such as display, keyboard and mouse. The I/O means may interface to a communications network such as an Ethernet network, a SCSI network, a telephone network, a cable system, or the like. Instructions for execution by the CPU and/or data structures for use by the CPU may be introduced into the computer system by way of data signals transferred over the communications network. The communication network may therefore define a means for coupling to, and causing the computer system to perform operations.

The system memory may hold executing portions of an operating system (OS), such as Windows™ or Unix, and of any executing parts of one or more application programs. The application programs generally communicate with the operating system by way of an API (application program interface). The one or more application programs may include software program(s) adapted to execute one or more methods described in FIGS. 1–19 above. Such software programs may be written using any existing software programming language such as C or C++ and compiled to execute in the operating system.

In one embodiment, the software program(s) may comprise (a) software code to identify one or more elements for reduction; (b) software code to analyze the effect of reducing one or more of said identified elements based on the topological and physical characteristics of said identified elements, and (c) software code to generate a second topology reflecting the reduction of one or more of said identified elements, if the effect is negligible. The second topology can be a reduced topology, or a topology that facilitates further reduction. In another embodiment, the software program(s) may further comprise software code to recursively executing (a), (b) and (c) until no further reduction is possible.

The first topology may include graphical representation of one or more circuits. The plurality of inter-connected elements in the first topology may thus comprise a plurality of circuit elements. In one embodiment, the software program(s) further comprises software code to analyze the physical characteristics of the circuits. The physical characteristics may include the variation of one or more delay measurements, such as Elmore delays resulting from the transformation.

The above embodiments of the software program(s) can be implemented either separately or together in one or more software packages. Simulations have shown that for large circuit networks having more than 100 nodes, implementing one or more embodiments of the present invention can result in over 90% reduction of nodes and other circuit elements.

While the above invention has been described with reference to certain preferred embodiments, the scope of the present invention is not limited to these embodiments. One skilled in the art may find variations of these embodiments which, nevertheless, fall within the spirit of the present invention, whose scope is defined by the claims set forth below.

What is claimed is:

1. A method of transforming a first topology to a reduced topology, said first topology representing an abstraction of one or more objects, said first topology further comprising a plurality of inter-connected elements, said method comprising:
    identifying one or more elements, wherein the identifying comprises generating a minimum spanning tree (MST) of the first topology and identifying one or more small-valued circuit elements in the MST;
    analyzing an effect of reducing one or more of said identified elements on topological and physical characteristics of said one or more objects, wherein the analyzing comprises analyzing a variation of one or more delay measurements after eliminating one or more of said small-valued circuit elements;
    generating a second topology reflecting a reduction of one or more identified elements in response to the effect of reducing one or more of said identified elements has negligible effect on the topological and physical characteristics of said one or more objects, wherein the reducing one or more said identified elements comprises eliminating one or more of said small-valued circuit elements in the MST.

2. The method of claim 1, further comprising
    (d) recursively executing the identifying, the analyzing, and the generating processes until no further reduction is possible.

3. The method of claim 2, wherein the second topology is a reduced topology.

4. The method of claim 1, wherein the identifying further comprises
    identifying one or more symmetric nodes from a single input tree structure.

5. The method of claim 4, wherein the identifying further comprises:
    identifying one or more symmetric nodes in a top-down fashion from the single input tree structure.

6. A method of transforming a circuit from a first topology to a reduced topology, said first topology comprising a plurality of inter-connected circuit elements, said method comprising:
    identifying one or more circuit elements having coupling effects;
    analyzing an effect of reducing one or more of said identified circuit elements on topological and physical characteristics of said circuit, wherein the analyzing comprises
        producing a first regional topology approximating an effect of eliminating one or more circuit elements having coupling effect;
        identifying one or more crossly-coupled nodes within the first regional topology;
        estimating coupling effects of each said one or more crossly-coupled nodes; and
    generating a second topology reflecting a reduction of one or more identified circuit elements in response to the effect of reducing one or more of said identified circuit elements on the topological and physical characteristics of said circuit satisfies the first predefined standard, wherein the generating includes replacing cross-coupling of each crossly-coupled node with its estimated coupling effects.

7. The method of claim 6, further comprising
    (d) recursively executing the identifying, the analyzing, and the generating processes until no further reduction is possible.

8. The method of claim 7, further comprising
    replacing the first predefined standard with a second predefined standard; and repeating the identifying, the analyzing, the generating, and the replacing processes for the reduced topology using the second predefined standard.

9. The method of claim 8, wherein the second predefined standard is a more relaxed standard than the first predefined standard.

10. The method of claim 6, wherein the identifying further comprises producing a topological approximation of the first topology.

11. The method of claim 10, wherein the topological approximation is a minimum spanning tree (MST).

12. The method of claim 11, wherein the identifying further comprises identifying one or more circuit elements from the MST, the value of each said one or more circuit elements is less than a threshold value.

13. The method of claim 12, wherein the generating further comprises eliminating the one or more circuit elements whose value is less than a threshold value.

14. The method of claim 10, wherein the identifying further comprises
identifying one or more symmetric nodes.

15. The method of claim 14, wherein the generating further comprises
merging said one or more symmetric nodes.

16. The method of claim 11, wherein the analyzing further comprises analyzing a variation of one or more delay measurements.

17. The method of claim 16, wherein the one or more delay measurements comprise Elmore delays.

18. The method of claim 6, wherein the identifying further comprises identifying one or more clusters of circuit elements.

19. The method of claim 18, wherein the analyzing further comprises
determining one or more center nodes for one or more clusters; and
analyzing an effect of moving the connection of one or more circuit elements connected to one or more nodes within one or more said clusters to one or more said center nodes.

20. The method of claim 19, wherein the one or more circuit elements connected to one or more nodes within one or more said clusters comprise one or more coupling capacitors.

21. The method of claim 6, wherein the identifying further comprises
identifying one or more circuit elements having similar input-output characteristics.

22. The method of claim 21, wherein the generating further comprises
merging one or more of said circuit elements having similar input-output characteristics into one equivalent circuit element.

23. The method of claim 6, wherein the identifying further comprises
identifying one or more candidate nodes including one or more quick nodes,
wherein said one or more candidates do not include any node having a capacitor directly connected to an input node.

24. The method of claim 23, wherein the generating further comprises
eliminating one or more candidate nodes only if its degree of connectivity is equal to two.

25. The method of claim 23, wherein the analyzing further comprises:
producing a regional topology approximating an effect of eliminating one or more of said candidate nodes; and,
determining, based on the regional topology, a difference in a number of circuit elements connected between two or more neighboring nodes of one or more of said candidate nodes, before and after eliminating one or more of said candidate nodes.

26. The method of claim 25, wherein the generating further comprises
eliminating one or more of said candidate nodes, if the regional topology produces less number of circuit elements connected between two or more neighboring nodes of one or more of said candidate nodes.

27. The method of claim 23, wherein the analyzing further comprises
determining if the topology after eliminating one or more of said candidate nodes contains a voltage divider structure.

28. The method of claim 27, wherein the generating further comprises
eliminating said one or more candidate nodes if the topology after eliminating one or more of said candidate nodes does not contain a voltage divider structure.

29. The method of claim 27, wherein the voltage divider structure comprises two or more capacitors connected in series.

30. The method of claim 6, wherein the identifying further comprises
identifying a regional topology comprising two nodes $N_1$ and $N_2$ connected to a common node $N_a$, wherein $N_1$ is connected to $N_a$ through resistance $R_1$, $N_2$ is connected to $N_a$ through resistance $R_2$, $N_1$ and $N_2$ further having capacitance $C_1$ and $C_2$, respectively, connected to either the ground or another common node, and wherein there is no other resistor connection to $N_1$ or $N_2$.

31. The method of claim 30, wherein the generating further comprises
merging $N_1$ and $N_2$, if (i) the value of $R_1*C_1$ is approximately equal to the value of $R_2*C_2$, and (ii) if $N_1$ and $N_2$ are connected to additional common nodes $N_{b1}$, $N_{b2}$, ..., $N_{bn}$ via capacitors $C_{c11}$, $C_{c12}$, ... $C_{c1n}$ and $C_{c21}$, $C_{c22}$, ... $C_{c2n}$, respectively, the value of $R_1*C_{c1i}$ is approximately equal to the value of $R_2*C_{c2i}$, for i=1 ... n.

32. The method of claim 6, wherein the plurality of circuit elements comprise resistors and capacitors.

33. The method of claim 6, wherein the one or more circuit elements having coupling effect comprise one or more coupling capacitors.

34. A programmed computer system for transforming a first topology to a reduced topology, said first topology representing an abstraction of one or more objects, said first topology further comprising a plurality of inter-connected elements, said programmed computer system comprising at least one memory having at least one region storing computer executable program code and at least one processor for executing the program code stored in said memory, wherein the program code comprises:
code to identify one or more elements, wherein the code to identify includes code to identify one or more clusters of circuit elements and code to determine one or more center nodes for one or more clusters;
code to analyze an effect of reducing one or more of said identified elements on topological and physical characteristics of said one or more objects, wherein the code to analyze includes code to analyze effect of moving a connection of the one or more circuit elements connected to one or more nodes within the one or more clusters to the one or more center nodes; and code to generate a second topology reflecting a reduction of one or more identified elements in response to reducing one or more of said identified elements has negligible effect on the topological and physical characteristics of said one or more objects, wherein the code to generate the second topology includes code to move the connection of the one or more circuit elements within the one or more clusters to the one or more center nodes.

35. The system of claim 34, wherein the program code further comprises code to recursively executing the code to identify, the code to analyze, and the code to generate until no further reduction is possible.

36. The system of claim 35, wherein the second topology is a reduced topology.

37. The system of claim 34, wherein the program code further comprises code to produce a topological approximation of the first topology.

38. The system of claim 37, wherein the topological approximation is a minimum spanning tree (MST).

39. The system of claim 38, wherein the program code further comprises code to identify one or more symmetric nodes.

40. The system of claim 39, wherein the program code further comprises code to identify one or more elements of small-value from the MST.

41. The system of claim 34, wherein the plurality of inter-connected elements comprise a plurality of circuit elements.

42. The system of claim 41, wherein the program code further comprises code to analyze a variation of one or more delay measurements.

43. The system of claim 41, wherein the program code further comprises code to identify one or more circuit elements having coupling effect.

44. The system of claim 43, wherein the program code further comprises:

code to produce a first regional topology approximating an effect of eliminating one or more circuit elements having coupling effect;

code to identify one or more crossly-coupled nodes within the first regional topology;

code to estimate coupling effects of each said one or more crossly-coupled nodes; and code to generate a second regional topology replacing cross-coupling of each crossly-coupled node with its estimated coupling effects.

45. The system of claim 41, wherein the program code further comprises code to identify one or more circuit elements having similar input-output characteristics.

46. The system of claim 45, wherein the program code further comprises code to merge one or more of said circuit elements having similar input-output characteristics into one equivalent circuit element.

47. The system of claim 41, wherein the program code further comprises code to identify one or more candidate nodes including one or more quick nodes, wherein said one or more candidates do not include any node having a capacitor directly connected to an input node.

48. The system of claim 47, wherein the program code further comprises code to eliminate one or more candidate nodes only if its degree of connectivity is equal to two.

49. The system of claim 47, wherein the program code further comprises:

code to produce a regional topology approximating an effect of eliminating one or more of said candidate nodes; and, code to determine, based on the regional topology, a difference in a number of circuit elements connected between two or more neighboring nodes of one or more of said candidate nodes, before and after eliminating one or more of said candidate nodes.

50. The system of claim 49, wherein the program code further comprises code to eliminate one or more of said candidate nodes, if the regional topology produces less number of circuit elements connected between two or more neighboring nodes of one or more of said candidate nodes.

51. The system of claim 47, wherein the program code further comprises code to determine if the topology after eliminating one or more of said candidate nodes contains a voltage divider structure.

52. The system of claim 51, wherein the program code further comprises code to eliminate said one or more candidate nodes if the topology after eliminating one or more of said candidate nodes does not contain a voltage divider structure.

53. The system of claim 41, wherein the program code further comprises code to identify a regional topology comprising two nodes $N_1$ and $N_2$ connected to two common nodes $N_a$ and $N_b$, wherein $N_1$ is connected to $N_a$ through capacitance $C_{c1}$ and to $N_b$ through resistance $R_1$, $N_2$ is connected to $N_a$ through capacitance $C_{c2}$ and to $N_b$ through resistance $R_2$, $N_1$ and $N_2$ further having ground capacitance $C_1$ and $C_2$, respectively.

54. The system of claim 53, wherein the program code further comprises code to merge $N_1$ and $N_2$, if the value of $R_1*C_1$ is approximately equal to the value of $R_2*C_2$ and the value of $R_1*C_{c1}$ is approximately equal to the value of $R_2*C_{c2}$.

55. Computer executable software code stored on a computer readable medium for transforming a first topology to a reduced topology, said first topology representing an abstraction of one or more objects, said first topology further comprising a plurality of inter-connected elements, said software code comprises:

code to identify one or more elements having similar input-output characteristics;

code to analyze an effect of reducing one or more of said identified elements on topological and physical characteristics of said one or more objects, and code to generate a second topology reflecting a reduction of one or more identified elements in response to reducing one or more of said identified elements has negligible effect on the topological and physical characteristics of said one or more objects, wherein the code to generate includes code to merge one or more of said circuit elements having similar input-output characteristics into one equivalent circuit element.

* * * * *